(12) United States Patent
Yamaguchi et al.

(10) Patent No.: US 7,282,745 B2
(45) Date of Patent: Oct. 16, 2007

(54) NITRIDE BASED SEMICONDUCTOR LIGHT-EMITTING DEVICE

(75) Inventors: Atsushi Yamaguchi, Tokyo (JP);
Masaru Kuramoto, Tokyo (JP);
Masaaki Nido, Tokyo (JP)

(73) Assignee: NEC Corporation, Tokyo (JP)

( * ) Notice: Subject to any disclaimer, the term of this patent is extended or adjusted under 35 U.S.C. 154(b) by 75 days.

(21) Appl. No.: 11/232,019

(22) Filed: Sep. 22, 2005

(65) Prior Publication Data

US 2006/0011903 A1 Jan. 19, 2006

Related U.S. Application Data

(62) Division of application No. 09/944,186, filed on Sep. 4, 2001, now Pat. No. 6,977,952.

(30) Foreign Application Priority Data

Sep. 1, 2000 (JP) ............................. 2000-265787

(51) Int. Cl.
*H01L 33/00* (2006.01)
(52) U.S. Cl. ............................ 257/94; 257/13; 257/79; 257/98; 257/99; 257/E33.001; 257/E33.054; 257/E33.077
(58) Field of Classification Search .................... None
See application file for complete search history.

(56) References Cited

U.S. PATENT DOCUMENTS 5,253,264 A * 10/1993 Suzuki et al. .......... 372/45.012
5,727,013 A * 3/1998 Botez et al. .................. 372/96
6,294,440 B1 9/2001 Tsuda et al.
6,459,096 B1 10/2002 Razeghi
6,555,403 B1 * 4/2003 Domen et al. ................ 438/22
6,642,546 B2 11/2003 Kuramoto et al.
6,977,952 B2 * 12/2005 Yamaguchi et al. ..... 372/45.01
2002/0030200 A1 3/2002 Yamaguchi et al.

FOREIGN PATENT DOCUMENTS

| JP | 10-12969 | 1/1998 |
|----|----------|--------|
| JP | A 11-307866 | 11/1999 |
| JP | A 11-340580 | 12/1999 |
| JP | 2000-58462 | 2/2000 |

OTHER PUBLICATIONS

Shuji Nakamura, "Current Status and Future Prospects of InGaN-Based Laser Diodes", JSAP International, Jan. 2000, Tokushima, Japan, pp. 5-17.

(Continued)

*Primary Examiner*—Wai-Sing Louie
(74) *Attorney, Agent, or Firm*—Young & Thompson

(57) ABSTRACT

The present invention provides a semiconductor device having a semiconductor multi-layer structure which includes at least an active layer having at least a quantum well, and the active layer further including at least a luminescent layer of $In_xAl_yGa_{1-x-y}N$ ($0<x<1$, $0 \leq y \leq 0.2$), wherein a threshold mode gain of each of the at least quantum well is not more than 12 cm$^{-1}$, and wherein a standard deviation of a microscopic fluctuation in a band gap energy of the at least luminescent layer is in the range of 75 meV to 200 meV.

10 Claims, 19 Drawing Sheets

OTHER PUBLICATIONS

Masaru Kuramoto et al., "Towards a Durable InGaN MQW LD—Room Temperature CW Operation of InGaN MQW Laser", NEC Res. & Develop., V. 41, Jan. 2000, pp. 74-86.

Shuji Nakamura et al., "InGaN/GaN/AlGaN-Based Laser Diodes with Modulation-Doped Strained-Layer Superlattices", Jpn. J. Appl. Phys., V. 36, 1997, pp. L1568-L1571.

Akira Usui et al., Thick GaN Epitaxial Growth with Low Dislocation Density by Hydride Vapor Phase Epitaxy, Jpn. J. Appl. Phys., V. 36, 1997, pp. L899-L902.

Shigefusa Chichibu, "Spatially Resolved Cathodoluminescence Spectra of InGaN Quantum Wells", Appl. Phys. Lett. 71, 1997, pp. 2346-2348.

W.W. Chow et al., "Microscopic Theory of Gain for an InGaN/AlGaN Quantum Well Laser", Appl. Phys. Lett. 71, 1997, pp. 2608-2610.

A. Atsushi Yamaguchi et al., "Optical Recombination Processes in High-Quality GaN Films and InGaN Quantum Wells Grown on Facet-Initiated Epitaxial Lateral Overgrown GaN Substrates", Jpn. J. Apppl. Phys., V. 39, 2000, pp. 2402-2406.

G. Martin et al., "Valence-Band Discontinuities of Wurtzite GaN, AlN, and InN Heterojunctions Measured by X-Ray Photoemission Spectroscopy", Appl. Phys. Lett. 68, 1996, pp. 2541-2543.

Domen et al., "Optical gain in GaN Based Semiconductors", Vertical-Cavity Lasers, Technologies for a Global Information Infrastructure, WDM Components Technology, Advanced Semiconductor Lasers and Applications, Gallium Nitride Materials, Processing, and Devices, 1997 Digest of the IEEE/LEOS Summer Topical M, Aug. 11, 1997, pp. 35-36, XP010243183.

Duxbury et al., "Indium segregation in InGaN quantum-well structures", Applied Physics Letters, American Institue of Physics, New York, Mar. 20, 2000, pp. 1600-1602, XP012024880.

Binet et al., "Optical pumping in nitride cavities with etched mirror facets", Materials Science and Engineering B, Elsevier Sequoia, Lausanne, CH, Dec. 18, 1997, pp. 183-187, XP004119130.

Nakamura, "Ingan-based blue laser diodes", IEEE Journal of Selected Topics in Quantum Electronics, IEEE Service Center, US, Jun. 1, 1997, pp. 712-718, XP000727336.

Fischer et al., "Direct imaging of the spectral emission characteristic of an InGaN/GaN-ultraviolet light-emitting diode by highly spectrally and spatially resovled electroluminescence and photoluminescence microscopy", Applied Physics Letters, American Institute of Physics, New York, US, Nov. 29, 1999, pp. 3440-3442, XP012024140.

Domen et al., "Interwell inhomogeneity of carrier injection in InGaN/GaN/AlGaN multiquantum well lasers", Applied Physics Letters, American Institute of Physics, New York, US, vol. 73, No. 19, Nov. 9, 1998, pp. 2775-2777, XP012021335.

* cited by examiner

NITRIDE BASED SEMICONDUCTOR LIGHT-EMITTING DEVICE

This application is a division of application Ser. No. 09/944,186, filed on Sep. 4, 2001, now U.S. Pat. No. 6,977,952, the entire contents of which are hereby incorporated by reference.

BACKGROUND OF THE INVENTION

1. Field of the Invention

The present invention relates to a semiconductor light emitting device, and more particularly to a gallium nitride based semiconductor light emitting device.

2. Description of the Related Art

Nitride based semiconductors are extremely attractive for a blue color laser device. In Japan Journal Applied Physics vol. 36, 1997, pp. 1568-1571, Nakamura et al. reported a continuous emission life-time for over 10,000 hours at 2 mW and at room temperature. FIG. 1 is a fragmentary cross sectional elevation view of a conventional laser diode. A GaN film 102 is formed on a sapphire substrate 101. Stripe-shaped $SiO_2$ masks 103 are formed on the GaN film 102.

Further, a gallium nitride based multilayer structure is selectively grown by use of the stripe-shaped $SiO_2$ masks 103, whereby the gallium nitride based multilayer structure includes low dislocation density regions 104 and high dislocation density regions 116 which are marked by hatching. The high dislocation density regions 116 can be obtained by the normal epitaxial growth in the vertical direction from the GaN film 102. The low dislocation density regions 104 can be obtained by the epitaxial lateral overgrowth over the stripe-shaped $SiO_2$ masks 103. A p-electrode 105 is provided on the low dislocation density region 104. The GaN film 102 has a high through-dislocation density.

The through-dislocations extend to the high dislocation density regions 116 as well illustrated in the hatched region of FIG. 1. The through-dislocations do not extend to the low dislocation density region 104. The high dislocation density region 116 has a high dislocation density of not less than $1 \times 10^{12}$ $m^{-2}$. The low dislocation density region 104 has a low dislocation density of less than $1 \times 10^{11}$ $m^{-2}$. In the vicinity of the center of the $SiO_2$ mask 103, the epitaxial lateral overgrowths from the peripheral sides of the $SiO_2$ mask 103 toward the center of the $SiO_2$ mask 103 experience collision, whereby another dislocation appears, for which reason the low dislocation density region 104 has another high dislocation density region over the center of the $SiO_2$ mask 103.

The p-electrode 105 is provided on the low dislocation density region 104, so that a current is injected into the low dislocation density region 104 to avoid any deterioration of the laser device due to the dislocation, and to obtain a possible long life-time.

Over an Si-doped n-GaN epitaxial lateral overgrowth substrate 106, an Si-doped n-type $In_{0.1}Ga_{0.9}N$ layer 107 is formed. An n-type cladding layer 108 is formed on the Si-doped n-type $In_{0.1}Ga_{0.9}N$ layer 107, wherein the n-type cladding layer 108 comprises 120 periods of Si-doped n-type GaN layers having a thickness of 2.5 nanometers, and undoped $Al_{0.14}Ga_{0.86}N$ layers having a thickness of 2.5 nanometers. An Si-doped n-type GaN optical confinement layer 109 having a thickness of 0.1 millimeter is formed on the n-type cladding layer 108.

A multiple quantum well active layer 110 is formed on the Si-doped n-type GaN optical confinement layer 109, wherein the multiple quantum well active layer 110 includes Si-doped n-type $In_{0.15}Ga_{0.85}N$ well layers having a thickness of 3.5 nanometers and Si-doped n-type $In_{0.02}Ga_{0.98}N$ potential barrier layers having a thickness of 10.5 nanometers. An Mg-doped p-type $Al_{0.2}Ga_{0.8}N$ cap layer 111 having a thickness of 20 nanometers is formed on the multiple quantum well active layer 110. An Mg-doped p-type GaN optical confinement layer 112 having a thickness of 0.1 millimeter is formed on the Mg-doped p-type $Al_{0.2}Ga_{0.8}N$ cap layer 111.

A p-type cladding layer 113 is formed on the Mg-doped p-type GaN optical confinement layer 112, wherein the p-type cladding layer 113 comprises 120 periods of Mg-doped p-type GaN layers having a thickness of 2.5 nanometers, and undoped $Al_{0.14}Ga_{0.86}N$ layers having a thickness of 2.5 nanometers. An Mg-doped p-type GaN contact layer 114 having a thickness of 0.05 millimeters is formed on the p-type cladding layer 113. A dry etching process is carried out to form a ridge structure. A p-electrode 105 and an n-electrode 115 are formed, wherein the p-electrode 105 comprises laminations of Ni-layer and Au-layer, whilst the n-electrode 115 comprises laminations of Ti-layer and Al-layer.

In Japan journal Applied Physics vol. 36, 1997, pp. L899-902 and NEC Research and Development vol. 41, 2000, No. 1, pp. 74-85, the present inventors addressed that the facet-initiated epitaxial lateral overgrowth method was used to reduce the dislocation density over entire region. In the facet-initiated epitaxial lateral overgrowth method, the strip-shaped $SiO_2$ masks are formed on the GaN layer over the sapphire substrate, and then a hydride vapor phase growth is used to cause the extending direction of the through-dislocations to be curved, whereby the dislocation density is relaxed, no high dislocation density region is formed. Thus, a low dislocation density n-GaN substrate can be prepared.

FIG. 2 is a fragmentary cross sectional elevation view of another conventional semiconductor laser device. An n-type cladding layer 122 was formed on a top surface of the n-GaN substrate 121, wherein the n-type cladding layer 122 comprises an Si-doped n-type $Al_{0.1}Ga_{0.9}N$ layer having a silicon impurity concentration of $4 \times 10^{17}$ $cm^{-3}$ and a thickness of 1.2 micrometers. An n-type optical confinement layer 123 was formed on a top surface of the n-type cladding layer 122, wherein the n-type optical confinement layer 123 comprises an Si-doped n-type GaN layer having a silicon impurity concentration of $4 \times 10^{17}$ $cm^{-3}$ and a thickness of 0.1 micrometer.

A multiple quantum well active layer 124 was formed on a top surface of the n-type optical confinement layer 123, wherein the multiple quantum well active layer 124 comprises three $In_{0.2}Ga_{0.8}N$ well layers having a thickness of 3 nanometers and Si-doped $In_{0.05}Ga_{0.95}N$ potential barrier layers having a silicon impurity concentration of $5 \times 10^{18}$ $cm^{-3}$ and a thickness of 5 micrometers.

A cap layer 125 was formed on a top surface of the multiple quantum well active layer 124, wherein the cap layer 125 comprises an Mg-doped p-type $Al_{0.2}Ga_{0.8}N$ layer. An optical confinement layer 126 was formed on a top surface of the cap layer 125, wherein the optical confinement layer 126 comprises an Mg-doped p-type GaN layer having a magnesium impurity concentration of $2 \times 10^{17}$ $cm^{-3}$ and a thickness of 0.1 micrometer. A p-type cladding layer 127 was formed on a top surface of the optical confinement layer 126, wherein the p-type cladding layer 127 comprises an Mg-doped p-type $Al_{0.1}Ga_{0.9}N$ layer having a magnesium impurity concentration of $2 \times 10^{17}$ $cm^{-3}$ and a thickness of 0.5 micrometers. A p-type contact layer 128 was formed on a top surface of the p-type cladding layer 127, wherein the p-type contact layer 128 comprises an Mg-doped p-type GaN layer having a magnesium impurity concentration of $2\times10^{17}$ cm$^{-3}$ and a thickness of 0.1 micrometer.

Those layers 122, 123, 124, 125, 126, 127, and 128 were formed by a low pressure metal organic vapor phase epitaxy method under a pressure of 200 hPa. A partial pressure of the ammonium gas for nitrogen source was maintained at 147 hPa. TMG (trimethyl gallium) was used for the Ga source material. TMA (trimethyl aluminum) was used for the Al source material. TMI (trimethyl indium) was used for the In source material. The growth temperature was maintained at 1050° C. except when the InGaN multiple quantum well active layer 124 was grown. In the growth of the InGaN multiple quantum well active layer 124, the growth temperature was maintained at 780° C.

A dry etching process was then carried out to selectively etch the p-type cladding layer 127 and the p-type contact layer 128 thereby forming a mesa structure 129. A silicon dioxide film 130 was formed on the mesa structure 129 and the upper surfaces of the p-type contact layer 128. The silicon dioxide film 130 was selectively removed from the top surface of the mesa structure 129 by use of an exposure technique, whereby the top surface of the p-type contact layer 128 was shown and a ridged structure was formed.

An n-type electrode 131 was formed on a bottom surface of the substrate 121, wherein the n-type electrode 131 comprises laminations of a titanium layer and an aluminum layer. A p-type electrode 132 was formed on a top surface of the p-type contact layer 128, wherein the p-type electrode 132 comprises laminations of a nickel layer and a gold layer. The above structure was then cleaved to form first and second facets. Two samples were prepared. In the first type sample, both the first and second facets were then coated with a highly reflective coat of a reflectance factor of 95%, wherein the highly reflective coat comprises laminations of titanium dioxide film and silicon dioxide film. In the second type sample, only the second facet was then coated with a highly reflective coat of a reflectance factor of 95%, wherein the highly reflective coat comprises laminations of titanium dioxide film and silicon dioxide film. The first facet was uncoated. The first type sample showed a threshold current density of 1.5 kA/cm$^2$. The second type sample showed a threshold current density of 3.0 kA/cm$^2$.

For the nitride based semiconductor blue color laser device, the InGaN quantum wells are provided in the active layer. It was not easy to prepare uniform InGaN amorphous films in the crystal growth. The InGaN quantum well active layer has compositional fluctuation. In accordance with the conventional common sense, the compositional fluctuation deteriorates the device performances or characteristics. The issue for the prior art was how to eliminate the compositional fluctuation.

In Applied Physics Letter vol. 71, p. 2346, 1997, Chichibu et al. reported results of considerations for the indium-compositional fluctuation and the carrier diffusion length basd on the observation of the cathode luminescence image to the InGaN quantum wells. It was presumed even the dislocation density was higher in order than the conventional one, a high luminescence efficiency could be obtained because potential fluctuations of electrons and holes caused by the indium compositional fluctuation localize carriers to prevent the carriers to be captured into the non-radiation centers. If this presumption is correct, it may be expectable that the increase of the compositional fluctuation without reducing the dislocation density improves the luminescent efficiency. Actually, however, the device performances depend on the optical gain, for which reason a variation in the state density due to the indium compositional fluctuation causes a large change in the optical gain.

In Applied Physics Letter, vol. 71, p. 2608, 1997, Chow et al. addressed that the compositional fluctuation makes the gain spectrum wide, whereby the gain peak is lowered and the threshold current density is dropped.

Japanese laid-open patent publication No. 11-340580 discloses to control the indium compositional fluctuation, wherein the compositional uniformity is improved to prevent the multi-wavelength laser emission. The compositional uniformity is measurable from the photo-luminescence peak wavelength distribution. This publication also discloses the following prior art. An InGaN non-amorphous large region is present. A small indium compositional region with indium index of not more than 0.2 may cause a compositional isolation due to the increase in the indium index.

If the InGaN layer has an indium index of about 0.15, then a half-width of the photo-luminescence spectrum in the macroscopic scale in the order of about 200 micrometers is extremely large due to non-uniformity of the crystal structure with the compositional isolation, and the half-width is at least 150 meV The publication discloses, as the prior invention, that a SiC substrate is used to adjust the crystal growth rate for reducing the photo-luminescent peak wavelength distribution to about 90 meV, thereby preventing the multi-wavelength laser emission.

The above Japanese publication is silent on the important issue of further reduction of the photo-luminescent peak wavelength distribution from 90 meV. The effect of the indium compositional fluctuation to the device performances had not sufficiently been clarified. The fundamental question on the compositional fluctuation of the InGaN quantum well in the active layer had also not been sufficiently clarified.

The most attractive application of the blue color laser device is a light source for wiring and reading to the optical disks such as DVD. For the read operation, about 3 mW output of the blue color laser beam is necessary. For the write operation, about 30 mW output of the blue color laser beam is necessary. If the laser device is used for DVD-RAM, then the laser device should have the high output performance of about 30 mW, for which reason one of the facets of the laser device is coated with a highly reflective coating. If the laser device is used for DVD-ROM, then the laser device should have the low output performance of about 3 mW, for which reason both the facets of the laser device are coated with a highly reflective coating.

Whereas it is desired that the high output laser device should have a life-time of at least 5000 hours at 30 mW and at 70° C., the actually realized life-time was at most 500 hours at 30 mW and at 60° C., which was reported by Nakamura et al. in JSAP International No. 1, pp. 5-17, 2000. The reduction in the driving current at 30 mW makes the life-time long, for which reason it is desirable to reduce the threshold current of the high output laser.

The low output laser device may be used for the portable DVD player with a battery. For this low output laser device, it is desirable to reduce the low power consumption. For this purpose, it is desirable to reduce the threshold current.

In the above circumstances, the development of a novel nitride based semiconductor light emitting device free from the above problems is desirable.

SUMMARY OF THE INVENTION

Accordingly, it is an object of the present invention to provide a novel semiconductor light emitting device free from the above problems.

It is a further object of the present invention to provide a novel nitride based semiconductor light emitting device exhibiting high output performances with a reduced threshold current.

It is a still further object of the present invention to provide a novel nitride based semiconductor light emitting device exhibiting low output performances with a reduced threshold current.

It is yet a further object of the present invention to provide a novel nitride based semiconductor light emitting device emitting a blue color laser beam with a reduced threshold current.

The present invention provides a semiconductor device having a semiconductor multi-layer structure which includes at least an active layer having at least a quantum well, and the active layer further including at least a luminescent layer of $In_xAl_yGa_{1-x-y}N$ (0<x<1, 0≦y≦0.2), wherein a threshold mode gain of each of the at least quantum well is not more than 12 cm$^{-1}$, and wherein a standard deviation of a microscopic fluctuation in a band gap energy of the at least luminescent layer is in the range of 75 meV to 200 meV.

The present invention also provides a semiconductor device having a semiconductor multi-layer structure which includes at least an active layer having at least a quantum well, and the active layer further including at least a luminescent layer of $In_xAl_yGa_{1-x-y}N$ (0<x<1, 0≦y≦0.2), wherein a threshold mode gain of each of the at least quantum well is more than 12 cm$^{-1}$, and wherein a standard deviation of a microscopic fluctuation in a band gap energy of the at least luminescent layer is not more than of 40 meV.

The above and other objects, features and advantages of the present invention will be apparent from the following descriptions.

BRIEF DESCRIPTION OF THE DRAWINGS

Preferred embodiments according to the present invention will be described in detail with reference to the accompanying drawings.

DETAILED DESCRIPTION OF PRESENT INVENTION

Figure 1:
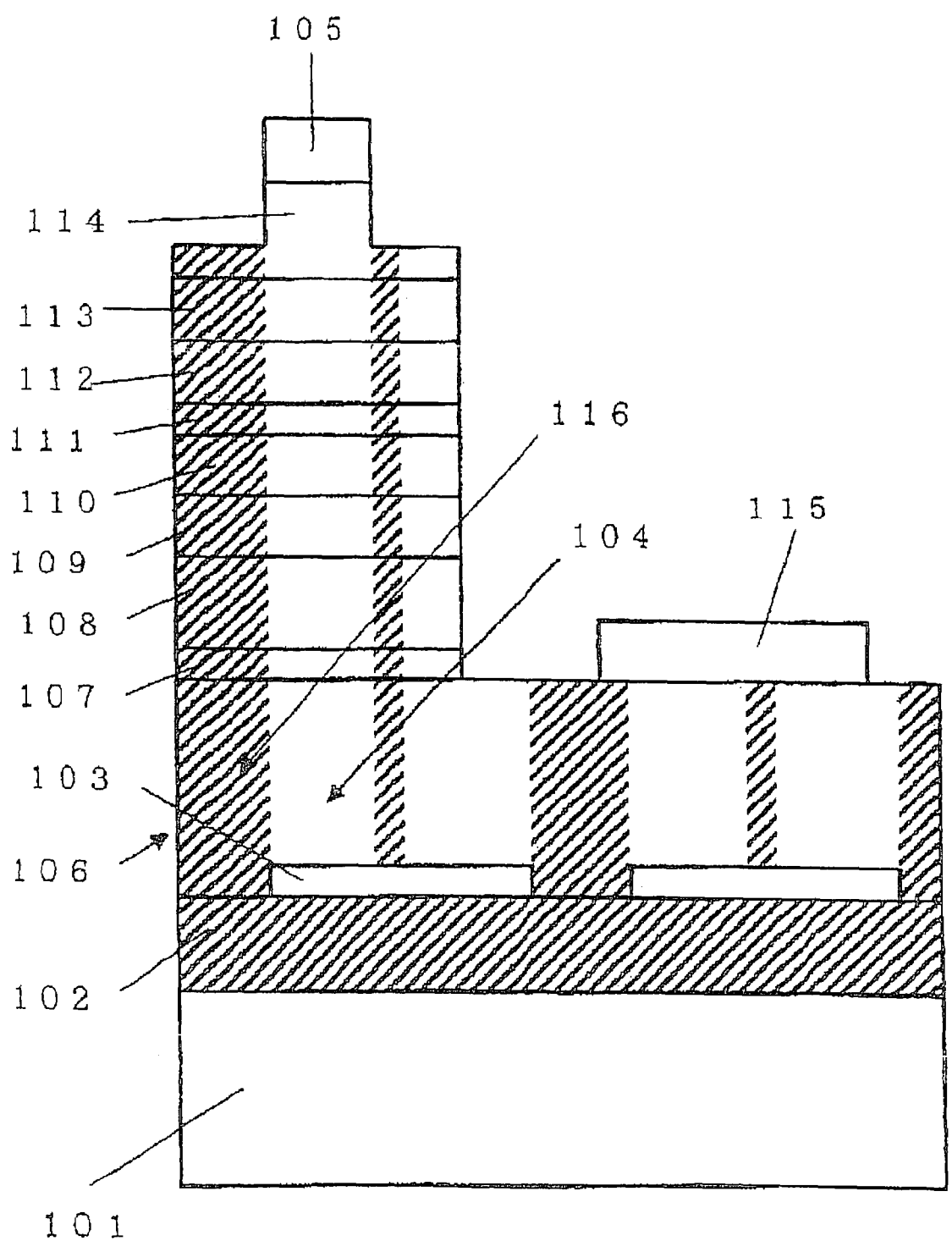
FIG. 1 is a fragmentary cross sectional elevation view of a conventional laser diode.

A first aspect of the present invention is a semiconductor device having a semiconductor multi-layer structure which includes at least an active layer having at least a quantum well, and the active layer further including at least a luminescent layer of $In_xAl_yGa_{1-x-y}N$ ($0<x<1$, $0\leq y\leq 0.2$), wherein a threshold mode gain of each of the at least quantum well is not more than 12 cm$^{-1}$, and wherein a standard deviation of a microscopic fluctuation in a band gap energy of the at least luminescent layer is in the range of 75 meV to 200 meV.

It is possible that a differential gain "dg/dn" of the at least active layer satisfies $0.5\times10^{-20}$ (m$^2$)$\leq dg/dn\leq 0.7\times10^{-20}$ (m$^2$).

It is also possible that the semiconductor device has an internal loss "$\alpha_i$" (cm$^{-1}$) which satisfies $\alpha_i\leq 12\times n-\alpha_m$ (cm$^{-1}$), where "$\alpha m$" is a mirror loss, and "n" is a number of the at least quantum well.

It is also possible that the semiconductor device has a slope efficiency "S" (W/A) which satisfies: $S\geq 3\times\{\alpha_m/(12\times n)\}\times[\{(1-R_1)\sqrt{(R_2)}\}/\{(1-\sqrt{(R_1R_2)})\times(\sqrt{(R_1)}+\sqrt{(R_2)})\}]$, where "$R_1$" is a first reflectance of a first cavity facet, from which a light is emitted, "$R_2$" is a second reflectance of a second cavity facet opposite to the first cavity facet, "$\alpha_m$" is a mirror loss, and "n" is a number of the at least quantum well.

It is also possible that the semiconductor device has a cavity length "L" of not less than 200 micrometers, and each of the first and second reflectances "$R_1$" and "$R_2$" is not less than 80% and less than 100%, and the slope efficiency "S" satisfies $S\geq 1.4/n$ (W/A).

It is also possible that the semiconductor device has a photo-luminescence peak wavelength distribution of not more than 40 meV.

It is also possible that the semiconductor multi-layer structure comprises a gallium-nitride-based multi-layer structure. The gallium-nitride-based multi-layer structure may extend over a gallium-nitride-based substrate. The gallium-nitride-based multi-layer structure may extend over a sapphire substrate. The gallium-nitride-based multi-layer structure may extend over a substrate having a surface dislocation density of less than $1\times10^8$/cm$^2$.

A second aspect of the present invention is a semiconductor device having a semiconductor multi-layer structure which includes at least an active layer having at least a quantum well, and the active layer further including at least a luminescent layer of $In_xAl_yGa_{1-x-y}N$ ($0<x<1$, $0\leq y\leq 0.2$), wherein a threshold mode gain of each of the at least quantum well is not more than 12 cm$^{-1}$, and wherein a differential gain "dg/dn" of the at least active layer satisfies $0.5\times10^{-20}$ (m$^2$)$\leq dg/dn\leq 0.7\times10^{-20}$ (m$^2$).

It is possible that a standard deviation of a microscopic fluctuation in a band gap energy of the at least luminescent layer is in the range of 75 meV to 200 meV.

It is also possible that the semiconductor device has an internal loss "$\alpha_i$" (cm$^{-1}$) which satisfies $\alpha_i\leq 12\times n-\alpha_m$ (cm$^{-1}$), where "$\alpha_m$" is a mirror loss, and "n" is a number of the at least quantum well.

It is also possible that the semiconductor device has a slope efficiency "S" (W/A) which satisfies: $S\geq 3\times\{\alpha_m/(12\times n)\}\times[\{(1-R_1)\sqrt{(R_2)}\}/\{(1-\sqrt{(R_1R_2)})\times(\sqrt{(R_1)}+\sqrt{(R_2)})\}]$, where "$R_1$" is a first reflectance of a first cavity facet, from which a light is emitted, "$R_2$" is a second reflectance of a second cavity facet opposite to the first cavity facet, "$\alpha m$" is a mirror loss, and "n" is a number of the at least quantum well.

It is also possible that the semiconductor device has a cavity length "L" of not less than 200 micrometers, and each of the first and second reflectances "$R_1$" and "$R_2$" is not less than 80% and less than 100%, and the slope efficiency "S" satisfies $S\geq 1.4/n$ (W/A).

It is also possible that the semiconductor device has a photo-luminescence peak wavelength distribution of not more than 40 meV.

It is also possible that the semiconductor multi-layer structure comprises a gallium-nitride-based multi-layer structure. The gallium-nitride-based multi-layer structure may extend over a gallium-nitride-based substrate. The gallium-nitride-based multi-layer structure may extend over a sapphire substrate. The gallium-nitride-based multi-layer structure may extend over a substrate having a surface dislocation density of less than $1\times10^8$/cm$^2$.

A third aspect of the present invention is a semiconductor device having a semiconductor multi-layer structure which includes at least an active layer having at least a quantum well, and the active layer further including at least a luminescent layer of $In_xAl_yGa_{1-x-y}N$ ($0<x<1$, $0\leq y\leq 0.2$), wherein the semiconductor device has an internal loss "$\alpha_i$" (cm$^{-1}$) which satisfies $\alpha_i\leq 12\times n-\alpha_m$ (cm$^{-1}$), where "$\alpha_m$" is a mirror loss, and "n" is a number of the at least quantum well, and wherein a standard deviation of a microscopic fluctuation in a band gap energy of the at least luminescent layer is in the range of 75 meV to 200 meV.

It is possible that a differential gain "dg/dn" of the at least active layer satisfies $0.5\times10^{-20}$ (m$^2$)$\leq dg/dn\leq 0.7\times10^{-20}$ (m$^2$).

It is also possible that a threshold mode gain of each of the at least quantum well is not more than 12 cm$^{-1}$.

It is also possible that the semiconductor device has a slope efficiency "S" (W/A) which satisfies: $S\geq 3\times\{\alpha_m/(12\times n)\}\times[\{(1-R_1)\sqrt{(R_2)}\}/\{(1-\sqrt{(R_1R_2)})\times(\sqrt{(R_1)}+\sqrt{(R_2)})\}]$, where "$R_1$" is a first reflectance of a first cavity facet, from which a light is emitted, "$R_2$" is a second reflectance of a second cavity facet opposite to the first cavity facet, "$\alpha_m$" is a mirror loss, and "n" is a number of the at least quantum well.

It is also possible that the semiconductor device has a cavity length "L" of not less than 200 micrometers, and each of the first and second reflectances "$R_1$" and "$R_2$" is not less than 80% and less than 100%, and the slope efficiency "S" satisfies $S\geq=1.4/n$ (W/A).

It is also possible that the semiconductor device has a photo-luminescence peak wavelength distribution of not more than 40 meV.

It is also possible that the semiconductor multi-layer structure comprises a gallium-nitride-based multi-layer structure. The gallium-nitride-based multi-layer structure may extend over a gallium-nitride-based substrate. The gallium-nitride-based multi-layer structure may extend over a sapphire substrate. The gallium-nitride-based multi-layer structure may extend over a substrate having a surface dislocation density of less than $1\times10^8$/cm$^2$.

A fourth aspect of the present invention is a semiconductor device having a semiconductor multi-layer structure which includes at least an active layer having at least a quantum well, and the active layer further including at least a luminescent layer of $In_xAl_yGa_{1-x-y}N$ ($0<x<1$, $0\leq y\leq 0.2$), wherein the semiconductor device has an internal loss "$\alpha_i$" (cm$^{-1}$) which satisfies $\alpha_i\leq 12\times n-\alpha_m$ (cm$^{-1}$), where "μm" is a mirror loss, and "n" is a number of the at least quantum well, and wherein a differential gain "dg/dn" of the at least active layer satisfies $0.5\times10^{-20}$ (m$^2$)$\leq dg/dn\leq 0.7\times10^{-20}$ (m$^2$).

It is possible that a standard deviation of a microscopic fluctuation in a band gap energy of the at least luminescent layer is in the range of 75 meV to 200 meV.

It is also possible that a threshold mode gain of each of the at least quantum well is not more than 12 cm$^{-1}$.

It is also possible that the semiconductor device has a slope efficiency "S" (W/A) which satisfies: $S \geq 3 \times \{\alpha_m/(12 \times n)\} \times [\{(1-R_1)\sqrt{(R_2)}\}/\{(1-\sqrt{(R_1 R_2)}) \times (\sqrt{(R_1)}+\sqrt{(R_2)})\}]$, where "$R_1$" is a first reflectance of a first cavity facet, from which a light is emitted, "$R_2$" is a second reflectance of a second cavity facet opposite to the first cavity facet, "$\alpha_m$" is a mirror loss, and "n" is a number of the at least quantum well.

It is also possible that the semiconductor device has a cavity length "L" of not less than 200 micrometers, and each of the first and second reflectances "$R_1$" and "$R_2$" is not less than 80% and less than 100%, and the slope efficiency "S" satisfies $S \geq 1.4/n$ (W/A).

It is also possible that the semiconductor device has a photo-luminescence peak wavelength distribution of not more than 40 meV.

It is also possible that the semiconductor multi-layer structure comprises a gallium-nitride-based multi-layer structure. The gallium-nitride-based multi-layer structure may extend over a gallium-nitride-based substrate. The gallium-nitride-based multi-layer structure may extend over a sapphire substrate. The gallium-nitride-based multi-layer structure may extend over a substrate having a surface dislocation density of less than $1 \times 10^8/cm^2$.

A fifth aspect of the present invention is a semiconductor device having a semiconductor multi-layer structure which includes at least an active layer having at least a quantum well, and the active layer further including at least a luminescent layer of $In_x Al_y Ga_{1-x-y} N$ ($0 < x < 1$, $0 \leq y \leq 0.2$), wherein the semiconductor device has a slope efficiency "S" (W/A) which satisfies: $S \leq 3 \times \{\alpha_m/(12 \times n)\} \times [\{(1-R_1)\sqrt{(R_2)}\}/\{(1-\sqrt{(R_1 R_2)}) \times (\sqrt{(R_1)}+\sqrt{(R_2)})\}]$, where "$R_1$" is a first reflectance of a cavity facet, from which a light is emitted, "$R_2$" is a second reflectance of a second cavity facet opposite to the first cavity facet, "$\alpha_m$" is a mirror loss, and "n" is a number of the at least quantum well, and wherein a standard deviation of a microscopic fluctuation in a band gap energy of the at least luminescent layer is in the range of 75 meV to 200 meV.

It is also possible that a differential gain "dg/dn" of the at least active layer satisfies $0.5 \times 10^{-20}$ (m$^2$) $\leq dg/dn \leq 0.7 \times 10^{-20}$ (m$^2$).

It is also possible that the semiconductor device has an internal loss "$\alpha_i$" (cm$^{-1}$) which satisfies $\alpha_i \leq 12 \times n - \alpha_m$ (cm$^{-1}$), where "$\alpha m$" is a mirror loss, and "n" is a number of the at least quantum well.

It is also possible that a threshold mode gain of each of the at least quantum well is not more than 12 cm$^{-1}$.

It is also possible that the semiconductor device has a cavity length "L" of not less than 200 micrometers, and each of the first and second reflectances "$R_1$" and "$R_2$" is not less than 80% and less than 100%, and the slope efficiency "S" satisfies $S \geq 1.4/n$ (W/A).

It is also possible that the semiconductor device has a photo-luminescence peak wavelength distribution of not more than 40 meV.

It is also possible that the semiconductor multi-layer structure comprises a gallium-nitride-based multi-layer structure. The gallium-nitride-based multi-layer structure may extend over a gallium-nitride-based substrate. The gallium-nitride-based multi-layer structure may extend over a sapphire substrate. The gallium-nitride-based multi-layer structure may extend over a substrate having a surface dislocation density of less than $1 \times 10^8/cm^2$.

A sixth aspect of the present invention is a semiconductor device having a semiconductor multi-layer structure which includes at least an active layer having at least a quantum well, and the active layer further including at least a luminescent layer of $In_x Al_y Ga_{1-x-y} N$ ($0 < x < 1$, $0 \leq y \leq 0.2$), wherein the semiconductor device has a slope efficiency "S" (W/A) which satisfies: $S \geq 3 \times \{\alpha_m/(12 \times n)\} \times [\{(1-R_1)\sqrt{(R_2)}\}/\{(1-\sqrt{(R_1 R_2)}) \times (\sqrt{((R_1)}+\sqrt{(R_2))})\}]$, where "$R_1$" is a first reflectance of a first cavity facet, from which a light is emitted, "$R_2$" is a second reflectance of a second cavity facet opposite to the first cavity facet, "$\alpha_m$" is a mirror loss, and "n" is a number of the at least quantum well, and wherein a differential gain "dg/dn" of the at least active layer satisfies $0.5 \times 10^{-20}$ (m$^2$) $\leq dg/dn \leq 0.7 \times 10^{-20}$ (m$^2$).

It is also possible that a standard deviation of a microscopic fluctuation in a band gap energy of the at least luminescent layer is in the range of 75 meV to 200 meV.

It is also possible that the semiconductor device has an internal loss "$\alpha_i$" (cm$^{-1}$) which satisfies $\alpha_i \leq 12 \times n - \alpha_m$ (cm$^{-1}$), where "$\alpha m$" is a mirror loss, and "n" is a number of the at least quantum well.

It is also possible that a threshold mode gain of each of the at least quantum well is not more than 12 cm$^{-1}$.

It is also possible that the semiconductor device has a cavity length "L" of not less than 200 micrometers, and each of the first and second reflectances "$R_1$" and "$R_2$" is not less than 80% and less than 100%, and the slope efficiency "S" satisfies $S \geq 1.4/n$ (W/A).

It is also possible that the semiconductor device has a photo-luminescence peak wavelength distribution of not more than 40 meV.

It is also possible that the semiconductor multi-layer structure comprises a gallium-nitride-based multi-layer structure. The gallium-nitride-based multi-layer structure may extend over a gallium-nitride-based substrate. The gallium-nitride-based multi-layer structure may extend over a sapphire substrate. The gallium-nitride-based multi-layer structure may extend over a substrate having a surface dislocation density of less than $1 \times 10^8/cm^2$.

A seventh aspect of the present invention is a semiconductor device having a semiconductor multi-layer structure which includes at least an active layer having at least a quantum well, and the active layer further including at least a luminescent layer of $In_x Al_y Ga_{1-x-y} N$ ($0 \leq x \leq 1$, $0 \leq y \leq 0.2$), wherein a threshold mode gain of each of the at least quantum well is more than 12 cm$^{-1}$, and wherein a standard deviation of a microscopic fluctuation in a band gap energy of the at least luminescent layer is not more than of 40 meV.

It is possible that a differential gain "dg/dn" of the at least active layer satisfies $dg/dn \geq 1.0 \times 10^{-20}$ (m$^2$).

It is also possible that the semiconductor device has an internal loss "$\alpha_i$" (cm$^{-1}$) which satisfies $\alpha_i > 12 \times n - \alpha_m$ (cm$^{-1}$), where "$\alpha_m$" is a mirror loss, and "n" is a number of the at least quantum well.

It is also possible that the semiconductor device has a slope efficiency "S" (W/A) which satisfies: $S < 3 \times \{\alpha_m/(12 \times n)\} \times [\{(1-R_1)\sqrt{(R_2)}\}/\{(1-\sqrt{(R_1 R_2)}) \times (\sqrt{(R_1)}+\sqrt{(R_2)})\}]$, where "$R_1$" is a first reflectance of a first cavity facet, from which a light is emitted, "$R_2$" is a second reflectance of a second cavity facet opposite to the first cavity facet, "$\alpha m$" is a mirror loss, and "n" is a number of the at least quantum well.

It is also possible that the semiconductor device has a cavity length "L" of not less than 1000 micrometers, and the first reflectance "$R_1$" is not more than 20%, the second reflectance "$R_2$" is not less than 80% and less than 100%, and the slope efficiency "S" satisfies S<2.1/n (W/A).

It is also possible that the semiconductor device has a photo-luminescence peak wavelength distribution of not more than 40 meV.

It is also possible that the semiconductor multi-layer structure comprises a gallium-nitride-based multi-layer structure. The gallium-nitride-based multi-layer structure may extend over a gallium-nitride-based substrate. The gallium-nitride-based multi-layer structure may extend over a sapphire substrate. The gallium-nitride-based multi-layer structure may extend over a substrate having a surface dislocation density of less than $1 \times 10^8/cm^2$.

An eighth aspect of the present invention is a semiconductor device having a semiconductor multi-layer structure which includes at least an active layer having at least a quantum well, and the active layer further including at least a luminescent layer of $In_xAl_yGa_{1-x-y}N$ (0<x<1, 0≦y=≦0.2), wherein a threshold mode gain of each of the at least quantum well is more than 12 $cm^{-1}$, and wherein a differential gain "dg/dn" of the at least active layer satisfies dg/dn≧$1.0 \times 10^{-20}$ ($m^2$).

It is possible that a standard deviation of a microscopic fluctuation in a band gap energy of the at least luminescent layer is not more than of 40 meV.

It is also possible that the semiconductor device has an internal loss "$\alpha_i$" ($cm^{-1}$) which satisfies $\alpha_i \geq 12 \times n - \alpha_m$ ($cm^{-1}$), where "$\alpha_m$" a mirror loss, and "n" is a number of the at least quantum well.

It is also possible that the semiconductor device has a slope efficiency "S" (W/A) which satisfies: S<3×{$\alpha_m$/(12×n)}×[{(1-$R_1$) $\sqrt{(R_2)}$}/{(1-$\sqrt{(R_1R_2)}$)×($\sqrt{(R_1)}+\sqrt{(R_2)}$)}], where "$R_1$" is a first reflectance of a first cavity facet, from which a light is emitted, "$R_2$" is a second reflectance of a second cavity facet opposite to the first cavity facet, "$\alpha_m$" is a mirror loss, and "n" is a number of the at least quantum well.

It is also possible that the semiconductor device has a cavity length "L" of not less than 1000 micrometers, and the first reflectance "$R_1$" is not more than 20%, the second reflectance "$R_2$" is not less than 80% and less than 100%, and the slope efficiency "S" satisfies S<2.1/n (W/A).

It is also possible that the semiconductor device has a photo-luminescence peak wavelength distribution of not more than 40 meV.

It is also possible that the semiconductor multi-layer structure comprises a gallium-nitride-based multi-layer structure. The gallium-nitride-based multi-layer structure may extend over a gallium-nitride-based substrate. The gallium-nitride-based multi-layer structure may extend over a sapphire substrate. The gallium-nitride-based multi-layer structure may extend over a substrate having a surface dislocation density of less than $1 \times 10^8/cm^2$.

A ninth aspect of the present invention is a semiconductor device having a semiconductor multi-layer structure which includes at least an active layer having at least a quantum well, and the active layer further including at least a luminescent layer of $In_xAl_yGa_{1-x-y}N$ (0<x<1, 0≦y≦0.2), wherein the semiconductor device has an internal loss "$\alpha_i$" ($cm^{-1}$) which satisfies $\alpha_i > 12 \times n - \alpha_m$ ($cm^{-1}$), where "$\alpha_m$" is a mirror loss, and "n" is a number of the at least quantum well, and wherein a standard deviation of a microscopic fluctuation in a band gap energy of the at least luminescent layer is not more than 40 meV.

It is possible that a differential gain "dg/dn" of the at least active layer satisfies dg/dn≧$1.0 \times 10^{-20}$ ($m^2$).

It is also possible that a threshold mode gain of each of the at least quantum well is more than 12 $cm^{-1}$.

It is also possible that the semiconductor device has a slope efficiency "S" (W/A) which satisfies: S<3×{$\alpha_m$/(12×n)}×[{(1-$R_1$) $\sqrt{(R_2)}$}/{(1-$\sqrt{(R_1R_2)}$)×($\sqrt{(R_1)}+\sqrt{(R_2)}$)}], where "$R_1$" is a first reflectance of a first cavity facet, from which a light is emitted, "$R_2$" is a second reflectance of a second cavity facet opposite to the first cavity facet, "$\alpha_m$" is a mirror loss, and "n" is a number of the at least quantum well.

It is also possible that the semiconductor device has a cavity length "L" of not less than 1000 micrometers, and the first reflectance "$R_1$" is not more than 20%, the second reflectance "$R_2$" is not less than 80% and less than 100%, and the slope efficiency "S" satisfies S<2.1/n (W/A).

It is also possible that the semiconductor device has a photo-luminescence peak wavelength distribution of not more than 40 meV.

It is also possible that the semiconductor multi-layer structure comprises a gallium-nitride-based multi-layer structure. The gallium-nitride-based multi-layer structure may extend over a gallium-nitride-based substrate. The gallium-nitride-based multi-layer structure may extend over a sapphire substrate. The gallium-nitride-based multi-layer structure may extend over a substrate having a surface dislocation density of less than $1 \times 10^8/cm^2$.

A tenth aspect of the present invention is a semiconductor device having a semiconductor multi-layer structure which includes at least an active layer having at least a quantum well, and the active layer further including at least a luminescent layer of $In_xAl_yGa_{1-x-y}N$ (0<x<1, 0≦y≦0.2), wherein the semiconductor device has an internal loss "$\alpha_i$" ($cm^{-1}$) which satisfies $\alpha_i > 12 \times n - \alpha_m$ ($cm^{-1}$), where "$\alpha_m$" is a mirror loss, and "n" is a number of the at least quantum well, and wherein a differential gain "dg/dn" of the at least active layer satisfies dg/dn≧$1.0 \times 10^{-20}$ ($m^2$).

It is possible that a standard deviation of a microscopic fluctuation in a band gap energy of the at least luminescent layer is not more than of 40 meV.

It is also possible that a threshold mode gain of each of the at least quantum well is more than 12 $cm^{-1}$.

It is also possible that the semiconductor device has a slope efficiency "S" (W/A) which satisfies: S<3+{$\alpha_m$/(12×n)}×[{(1-$R_1$) $\sqrt{(R_2)}$}/{(1-$\sqrt{(R_1R_2)}$)×($\sqrt{(R_1)}+\sqrt{(R_2)}$)}], where "$R_1$" is a first reflectance of a first cavity facet, from which a light is emitted, "$R_2$" is a second reflectance of a second cavity facet opposite to the first cavity facet, "αm" is a mirror loss, and "n" is a number of the at least quantum well.

It is also possible that the semiconductor device has a cavity length "L" of not less than 1000 micrometers, and the first reflectance "$R_1$" is not more than 20%, the second reflectance "$R_2$" is not less than 80% and less than 100%, and the slope efficiency "S" satisfies S<2.1/n (W/A).

It is also possible that the semiconductor device has a photo-luminescence peak wavelength distribution of not more than 40 meV.

It is also possible that the semiconductor multi-layer structure comprises a gallium-nitride-based multi-layer structure. The gallium-nitride-based multi-layer structure may extend over a gallium-nitride-based substrate. The gallium-nitride-based multi-layer structure may extend over a sapphire substrate. The gallium-nitride-based multi-layer structure may extend over a substrate having a surface dislocation density of less than $1 \times 10^8/cm^2$.

An eleventh aspect of the present invention is a semiconductor device having a semiconductor multi-layer structure which includes at least an active layer having at least a quantum well, and the active layer further including at least a luminescent layer of $In_xAl_yGa_{1-x-y}N$ (0<x<1, 0≦y≦0.2), wherein the semiconductor device has a slope efficiency "S"

(W/A) which satisfies: $S<3\times\{\alpha_m/(12\times n)\}\times[\{(1-R_1)\sqrt{(R_2)}\}/\{(1-\sqrt{(R_1R_2)})\times(\sqrt{(R_1)}+\sqrt{(R_2)})\}]$, where "$R_1$" is a first reflectance of a first cavity facet, from which a light is emitted, "$R_2$" is a second reflectance of a second cavity facet opposite to the first cavity facet, "$\alpha_m$" is a mirror loss, and "n" is a number of the at least quantum well, and wherein a standard deviation of a microscopic fluctuation in a band gap energy of the at least luminescent layer is not more than of 40 meV.

It is also possible that a differential gain "dg/dn" of the at least active layer satisfies $dg/dn \geq 1.0\times10^{-20}$ (m$^2$).

It is also possible that a threshold mode gain of each of the at least quantum well is more than 12 cm$^{-1}$.

It is also possible that the semiconductor device has an internal loss "$\alpha_i$" (cm$^{-1}$) which satisfies $\alpha_i > 12\times n - \alpha_m$ (cm$^{-1}$), where "$\alpha_m$" is a mirror loss, and "n" is a number of the at least quantum well.

It is also possible that the semiconductor device has a cavity length "L" of not less than 1000 micrometers, and the first reflectance "$R_1$" is not more than 20%, the second reflectance "$R_2$" is not less than 80% and less than 100%, and the slope efficiency "S" satisfies $S<2.1/n$ (W/A).

It is also possible that the semiconductor device has a photo-luminescence peak wavelength distribution of not more than 40 meV.

It is also possible that the semiconductor multi-layer structure comprises a gallium-nitride-based multi-layer structure.

It is also possible that the gallium-nitride-based multi-layer structure may extend over a gallium-nitride-based substrate.

It is also possible that the gallium-nitride-based multi-layer structure may extend over a sapphire substrate.

It is also possible that the gallium-nitride-based multi-layer structure may extend over a substrate having a surface dislocation density of less than $1\times10^8$/cm$^2$.

A twelfth aspect of the present invention is a semiconductor device having a semiconductor multi-layer structure which includes at least an active layer having at least a quantum well, and the active layer further including at least a luminescent layer of $In_xAl_yGa_{1-x-y}N$ (0<x<1, 0≦y≦0.2), wherein the semiconductor device has a slope efficiency "S" (W/A) which satisfies: $S<3\times\{\alpha_m/(12\times n)\}\times[\{(1-R_1)\sqrt{(R_2)}\}/\{(1-\sqrt{(R_1R_2)})\times(\sqrt{(R_1)}+\sqrt{(R_2)})\}]$, where "$R_1$" is a first reflectance of a first cavity facet, from which a light is emitted, "$R_2$" is a second reflectance of a second cavity facet opposite to the first cavity facet, "$\alpha_m$" is a mirror loss, and "n" is a number of the at least quantum well, and wherein a standard deviation of a microscopic fluctuation in a band gap energy of the at least luminescent layer is not more than of 40 meV.

It is possible that a differential gain "dg/dn" of the at least active layer satisfies $dg/dn \geq 1.0\times10^{-20}$ (m$^2$).

It is also possible that a threshold mode gain of each of the at least quantum well is more than 12 cm$^{-1}$.

It is also possible that the semiconductor device has an internal loss "$\alpha_i$" (cm$^{-1}$) which satisfies $\alpha_i > 12\times n - \alpha_m$ (cm$^{-1}$), where "a m" is a mirror loss, and "n" is a number of the at least quantum well.

It is also possible that the semiconductor device has a cavity length "L" of not less than 1000 micrometers, and the first reflectance "$R_1$" is not more than 20%, the second reflectance "$R_2$" is not less than 80% and less than 100%, and the slope efficiency "S" satisfies $S<2.1/n$ (W/A).

It is also possible that the semiconductor device has a photo-luminescence peak wavelength distribution of not more than 40 meV.

It is also possible that the semiconductor multi-layer structure comprises a gallium-nitride-based multi-layer structure. The gallium-nitride-based multi-layer structure may extend over a gallium-nitride-based substrate. The gallium-nitride-based multi-layer structure may extend over a sapphire substrate. The gallium-nitride-based multi-layer structure may extend over a substrate having a surface dislocation density of less than $1\times10^8$/cm$^2$.

The above first to sixth aspects of the present inventions are concerned with the first type semiconductor light-emitting device, for example, the first type semiconductor laser device which might be suitable for a relative low output characteristic and a relatively low power consumption characteristic. Various applications of the first type semiconductor laser device might be possible. For example, if the first type semiconductor laser device is applied to DVD, this first type semiconductor laser device might be suitable for read operation only.

The above seventh to twelfth aspects of the present inventions are concerned with the second type semiconductor light-emitting device, for example, the second type semiconductor laser device which might be suitable for a relative high output characteristic. Various applications of the second type semiconductor laser device might be possible. For example, if the second type semiconductor laser device is applied to DVD, this first type semiconductor laser device might be suitable for write operation only.

For the above semiconductor devices of the first to twelfth aspects of the present inventions, a compositional distribution and a microscopic fluctuation in energy band gap of the active layer are important parameters. Throughout the present specification, the word "fluctuation in compositional profile" means a position-dependent fluctuation possessed by a spatial distribution in compositional profile, which corresponds to a position-dependent variation in compositional profile.

The word "fluctuation in band gap energy" means a position-dependent fluctuation possessed by a spatial distribution in band gap energy, which corresponds to a position-dependent variation in band gap energy. The word "microscopic fluctuation" means a position-dependent fluctuation in a microscopic space which is defined by the sub-micron or smaller order scale which is less than 1 micrometer scale. The word "macroscopic fluctuation" means a position-dependent fluctuation in a macroscopic space which is defined by 1 micron or larger order scale. The "macroscopic fluctuation" is measurable by a micro-photo-luminescence measurement method with a beam spot diameter of not less than 1 micrometer. The "microscopic fluctuation" is hard to be measured by the photo-luminescence measurement method with the beam spot diameter of not less than 1 micrometer.

Further, the words "photo-luminescence layer" and "luminescent layer" mean the layer which is included in the active layer and which allows an inverted population, thereby to generate a certain gain. If the active layer comprises a quantum well structure, one or more quantum well layers correspond to the luminescent layers. If the active layer has a multiple quantum well structure, then the fluctuation means a fluctuation existing in all quantum well layers. If the active layer is free of the quantum well structure, then the active layer might generally correspond to the luminescent layer.

The "micro-fluctuation" in the sub-micron or smaller order scale is important for the present invention. In accordance with the conventional common sense, since the conventional gallium nitride laser diode has the InGaN active layer which include many dislocations, it is considered that an indium-compositional fluctuation is desirable for obtaining good laser performances.

Contrary to the conventional common sense, in accordance with the present invention, it is important that the surface dislocation density of the base layer or the surface dislocation density of the bottom surface of the active layer is reduced as many as possible and further that both the micro-fluctuations in the composition and the band gap energy of the luminescent layer in the active layer are controlled within predetermined individual levels as defined above so as to keep both the high photo-luminescent efficiency and the desirable laser threshold value and further to realize the possible long life-time of the laser device.

There are two main reasons for deteriorating the semiconductor laser device. One is the deterioration of the facet. Another is the increase in the defects of the active layer. The facet deterioration is also so called to as impact deterioration, wherein the current laser emission is instantaneously discontinued. The increase in the defects of the active layer is gentle and not instantaneous, for which reason the operating current is gradually decreased. It was already confirmed that the conventional laser diode shown in FIG. 1 shows a gradual decrease in the operating current due to the gradual increase the defects of the active layer. In order to realize the long life-time of the device, it is effective to prevent the increase of defects of the active layer.

The fluctuations in the compositions and in the band gap energy of the active layer might generate local strains in the active layer. Those local strains cause defects in the active layer upon receipt of energy from heat, photons and carriers in the device operation at a high temperature. The present inventors considered that in order to realize a longer life-time for the device, it is effective to reduce the fluctuations in the compositional profile and band gap energy profile of the active layer.

Each of the fluctuations in the compositional profile and the band gap energy profile of the active layer are classified into two types, first one is the "macroscopic fluctuation" in the macroscopic scale, and second one is the "microscopic fluctuation" in the microscopic scale. The "macroscopic fluctuation" means the fluctuation in the scale which is measurable by the micro-photo-luminescence measurement with a beam spot diameter of not less than 1 micrometer, wherein the "microscopic fluctuation" is represented by a measured photo-luminescence peak wavelength distribution.

The photo-luminescence peak wavelength distribution is ranged from a maximum value to a minimum value of the measured photo-luminescence peak wavelength. In the prior art common sense, the fluctuation generally means the "macroscopic fluctuation" which is measurable by the photo-luminescence measurement, namely the fluctuation in the 1-micrometer order scale because the micro-photo-luminescence measurement is made with the beam spot diameter of not less than 1 micrometer. In Japanese laid-open patent publication No. 11-340580, the described fluctuation is the "macroscopic fluctuation" in the macroscopic scale, and this prior art was to reduce the "macroscopic fluctuation" for preventing laser emission in multiple wavelength.

The present invention focus on the fluctuation in the shorter or smaller scale than "macroscopic fluctuation" in the above conventional common sense. The present invention focus on the "microscopic fluctuation" in the microscopic scale which is shorter than the carrier diffusion length, for example, approximately 1 micrometers in accordance with the present invention, the "microscopic fluctuation" is of the sub-micron order scale, typically 500 nanometers or less. The present invention intends to control the "microscopic fluctuation" for controlling the local strains in the active layer including the luminescent layer in order to realize the long life-time of the semiconductor laser diode.

In Japanese laid-open patent publication No. 11-340580, it is mentioned to reduce the fluctuation in the macroscopic scale for controlling the laser emission in multiple wavelengths. The reduction in the fluctuation in the macroscopic scale does not realize the long life-time of the device in the operation at high temperature for the reasons which will be described below in the embodiments.

The present invention is to reduce the "microscopic fluctuations" in the compositional profile and the band gap energy profile of the active layer in the microscopic scale which is immeasurable by the micro-photo-luminescence measurement, whereby the long life-time of the device in the operation at high temperature is realized.

In the past, there had been no investigation on control of the "microscopic fluctuations" in the microscopic scale nor report about any influence of the "microscopic fluctuations" to the device performances. There had not been known any certain or available method of how to reduce the "microscopic fluctuations" in the microscopic scale. As disclosed in Japanese laid-open patent publication No. 11-340580, it had been known that the "macroscopic fluctuations" in the macroscopic scale is reducible by reducing the dislocation density of the substrate and adjusting the growth rate of the active layer. The reductions of the "microscopic fluctuations" are not obtained by those conventional methods.

The present invention was established by drawing the attention to the "microscopic fluctuations" which had never been considered in the prior art. The present invention was realized by the reductions in the "microscopic fluctuations" in the compositional profile and the band gap energy profile of the active layer in the microscopic scale, and also by keeping a desirable high differential gain if the semiconductor device is applied to the laser diode. Those reductions in the "microscopic fluctuations" provide the effects that the local strain in the luminescent layer included in the active layer is controlled to reduce a threshold current of the laser.

The "microscopic fluctuation" of the threshold mode gain value for one of the quantum wells and the "microscopic fluctuation" of the internal loss are important factors for the present invention. For application to the first type semiconductor light emitting device with the low output performance, it is preferable that the threshold mode gain value is not more than a predetermined value, and the "microscopic fluctuation" thereof is within a predetermined range. For application to the second type semiconductor light emitting device with the high output performance, it is preferable that the threshold mode gain value is not less than a predetermined value, and the "microscopic fluctuation" thereof is within a predetermined range.

The first type semiconductor light emitting device of the present invention shows low output performances and low power consumption, for which reasons the first type semiconductor light emitting device might be suitable for the light source for optical disk. The following descriptions will focus on the reason why the threshold current density may be reduced.

The present inventors conducted the study in the theoretical viewpoints to have confirmed how "compositional fluctuation" of the active layer having one or more InGaN quantum wells influence to the threshold current density. It was assumed that a spatial variation (fluctuation) of the band gap due to the indium-compositional fluctuation would have the normal distribution, and the standard deviation "$\sigma_g$" of the spatial variation (fluctuation) of the energy band gap would be an index for the "compositional fluctuation".

In correspondence with this, it was also assumed that spatial distributions of electrons and holes depend on a band off-set ratio of 3:7. Both the electrons and holes have parabolic distribution relationships. State densities for electrons and holes were calculated respectively, provided that an energy band of a quantum state of "n=1" was considered for electrons, and an energy band of a quantum state of "n=1" was considered for A-band and B-band for holes. If no fluctuation is present, the state densities of the quantum wells are given by sharp step-functions with rapid rising. If a certain fluctuation is present, the state densities of the quantum wells are given by error-functions with gentle rising. The use of quantized state densities for holes and electrons allows calculations of optical gain characteristics for the various quantum wells with various compositional fluctuations.

The present inventors calculated the optical gains, assumed that carriers, for example, holes and electrons in current injections have spatially uniform Fermi energies. This assumption was made in consideration of a spatial scale of the compositional fluctuation. The assumption that in the current injection, the Fermi energies would be spatially uniform means that the spatial scale of the compositional fluctuation is smaller than the diffusion lengths of the carriers, for example, electrons and holes. If the diffusion length of the carriers is about 1 millimeter, the spatial scale of the compositional fluctuation is not larger than the sub-micron order.

In Applied Physics Letter vol. 71, p-2346, 1997, Chichibu et al. reported that the scale of the indium-compositional fluctuation of the InGaN quantum wells observed by a cathode luminescence measurement method is about a several tends nanometers to a few hundreds nanometers. This report supports that the above assumptions made by the present inventors would be reasonable.

Figure 4:
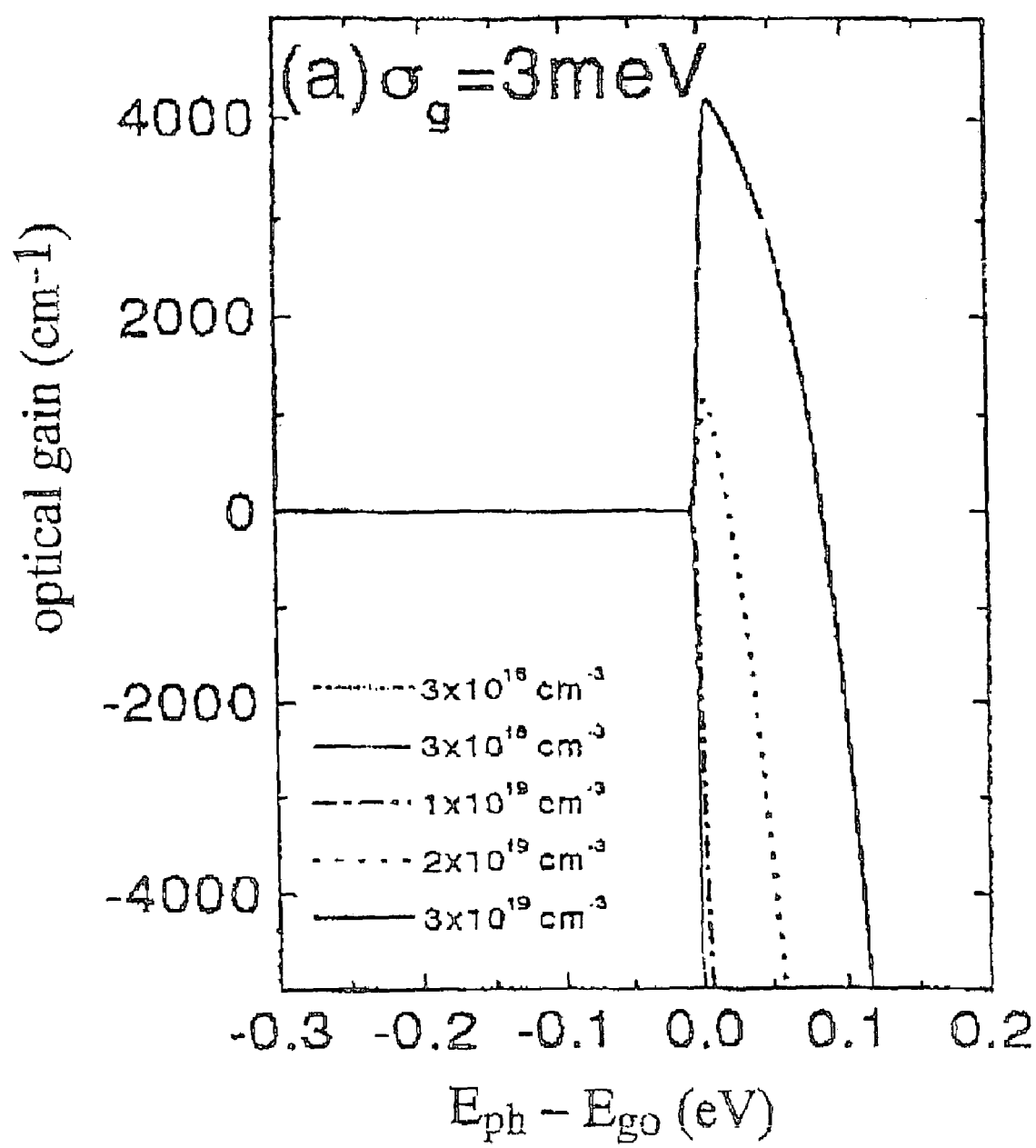
FIG. 4 is a diagram illustrative of calculated optical gain spectrums versus "Eph"–"Ego" at various carrier densities and at a room temperature (300K) for the InGaN quantum well when the standard deviation "$\sigma_g$" of the spatial variation (fluctuation) of the energy band gap is small, for example, equal to 3 meV, wherein "Eph" represents the band gap energy, and "Ego" is an averaged value of the band gap energies.

FIG. 4 is a diagram illustrative of calculated optical gain spectrums versus "Eph"–"Ego" at various carrier densities and at a room temperature (300K) for the InGaN quantum well when the standard deviation "$\sigma_g$" of the spatial variation (fluctuation) of the energy band gap is small, for example, equal to 3 meV, wherein "Eph" represents the band gap energy, and "Ego" is an averaged value of the band gap energies.

Figure 5:
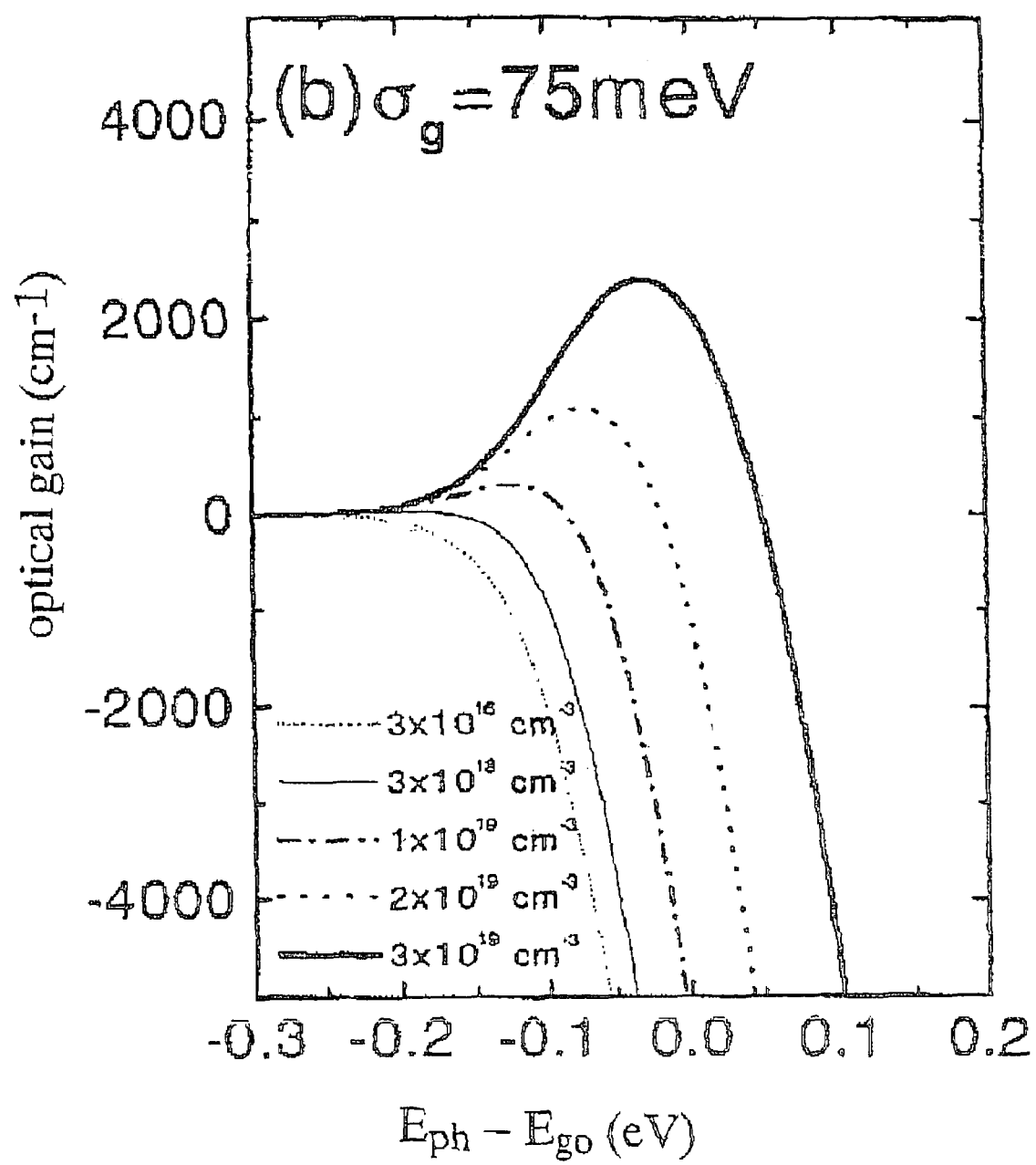
FIG. 5 is a diagram illustrative of calculated optical gain spectrums versus "Eph"–"Ego" at various carrier densities and at a room temperature (300K) for the InGaN quantum well when the standard deviation "$\sigma_g$" of the spatial variation (fluctuation) of the energy band gap is large, for example, equal to 75 meV, wherein "Eph" represents the band gap energy, and "Ego" is an averaged value of the band gap energies.

FIG. 5 is a diagram illustrative of calculated optical gain spectrums versus "Eph"–"Ego" at various carrier densities and at a room temperature (300K) for the InGaN quantum well when the standard deviation "$\sigma_g$" of the spatial variation (fluctuation) of the energy band gap is large, for example, equal to 75 meV, wherein "Eph" represents the band gap energy, and "Ego" is an averaged value of the band gap energies.

For FIGS. 4 and 5, a dotted narrow line represents a calculated optical gain spectrum at a carrier density of $3 \times 10^{15}$ cm$^{-3}$. A continuous narrow line represents another calculated optical gain spectrum at a carrier density of $3 \times 10^{18}$ cm$^{-3}$. A broken broad line represents still another calculated optical gain spectrum at a carrier density of $1 \times 10^{19}$ cm$^{-3}$. A dotted broad line represents yet another calculated optical gain spectrum at a carrier density of $2 \times 10^{19}$ cm$^{-3}$. A continuous broad line represents yet another calculated optical gain spectrum at a carrier density of $3 \times 10^{19}$ cm$^{-3}$.

As shown in FIG. 4, when the carrier density is $3 \times 10^{15}$ cm$^{-3}$ represented by the dotted narrow line, no optical gain is generated under the low standard deviation "$\sigma_g$" equal to 3 meV, where no dotted narrow line appears in FIG. 4. If the standard deviation "$\sigma_g$" of the spatial variation (fluctuation) of the energy band gap is small, then a light-transparent carrier density is relatively large. As the carrier density increases up to $3 \times 10^{19}$ cm$^{-3}$, abrupt or rapid increase in the state density is caused to obtain a narrow and sharp-peaked gain spectrum and a large differential gain. The sharp-peak points of the gain spectrums are slightly shifted toward a high energy side and rapidly and greatly shifted toward a high gain side when increasing the carrier density.

By contrast, as shown in FIG. 5, when the carrier density is $3 \times 10^{15}$ cm$^{-3}$ represented by the dotted narrow line, a certain optical gain is generated under the high standard deviation "$\sigma_g$" equal to 75 meV, where a dotted narrow line appears in FIG. 5. If the standard deviation "$\sigma_g$" of the spatial variation (fluctuation) of the energy band gap is large, then carriers are flown into the potential valleys provided by the potential fluctuations, whereby the carriers are localized and concentrated in the potential valleys. This causes inverted populations in localized areas corresponding to the potential valleys.

The optical gain is caused in a localized state which is a lower energy side than the averaged band gap energy "Ego" which corresponds to 0.0 of "Eph"–"Ego". The inverted population is caused to generate the optical gain in the spatially localized relatively narrow region. In the other region free of any inverted population, no absorption loss is caused, for which reason the other region is transparent to the light. Even the optical gain is in fact caused in the localized region, this optical gain may be observed as a certain gain value in total on the entire regions. In this case, the optical gain is quickly saturated.

As the carrier density increases up to $3 \times 10^{19}$ cm$^{-3}$, gentle increase in the state density is caused to obtain a wide and gently-peaked gain spectrum and a small differential gain. The gently-peak points of the gain spectrums are largely shifted toward the high energy side and gently shifted toward the high gain side when increasing the carrier density.

Figure 6:
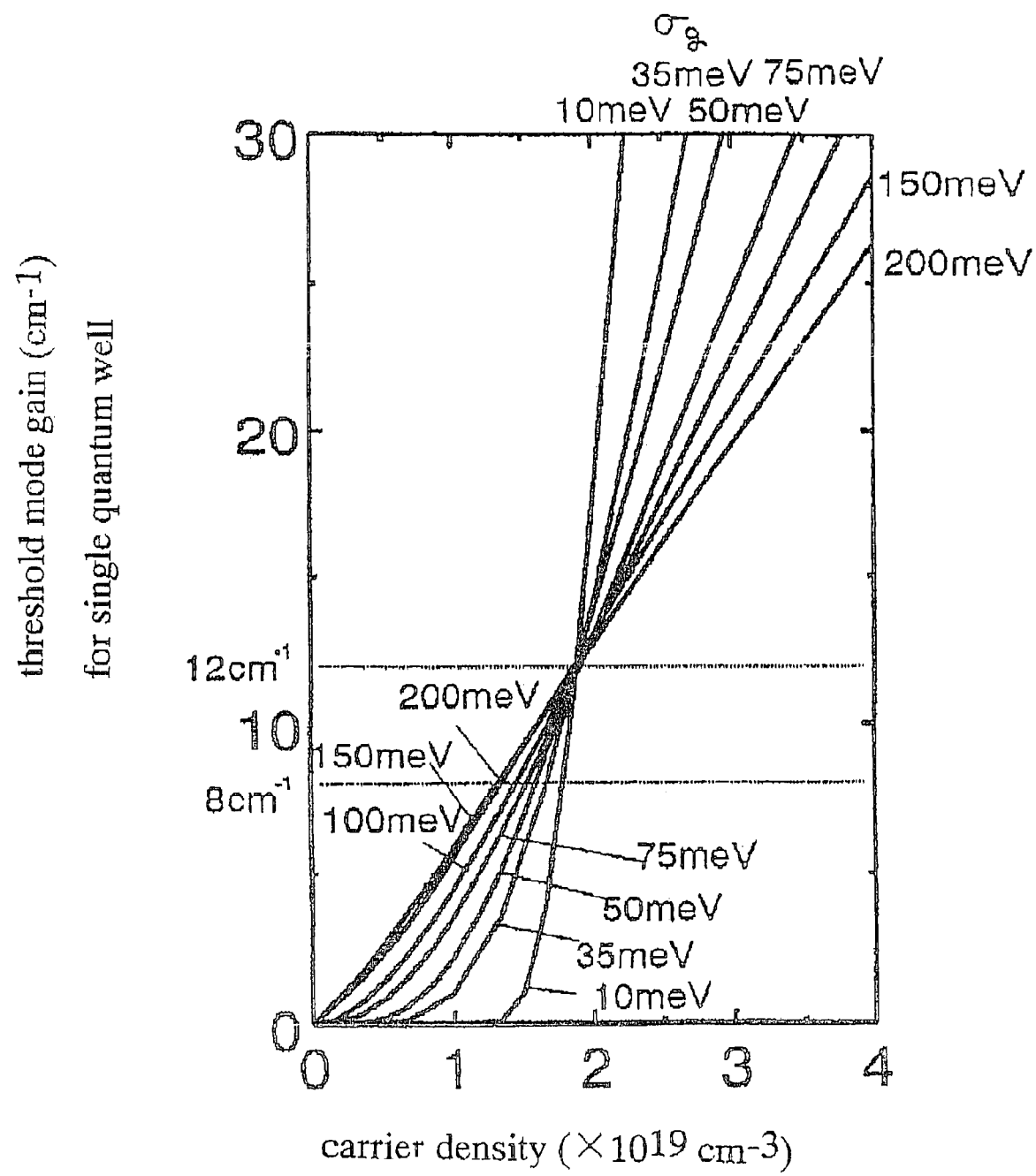
FIG. 6 is a diagram illustrative of variations of threshold mode gains for one InGaN quantum well over carrier densities under conditions of various standard deviations "$\sigma_g$" of the spatial variation (fluctuation) of the energy band gap, for example, 10 meV, 35 meV, 50 meV, 75 meV, 150 meV, and 200 meV.

FIG. 6 is a diagram illustrative of variations of threshold mode gains for one InGaN quantum well over carrier densities under conditions of various standard deviations "$\sigma_g$" of the spatial variation (fluctuation) of the energy band gap, for example, 10 meV, 35 meV, 50 meV, 75 meV, 150 meV, and 200 meV. As described above, the large spatial variation (fluctuation) of the energy band gap is advantageous in reducing the transparent carrier density, but disadvantageous in reducing the differential gain. An issue is now raised of whether the presence of the fluctuation of the energy band gap would be advantageous or disadvantageous in view of the threshold carrier density. This issue, however, depends on the threshold mode gain for one quantum well.

If the threshold mode gain for one quantum well is less than 12 cm$^{-1}$, the increase from 10 meV to 200 meV of the standard deviations "$\sigma_g$" of the spatial variation (fluctuation) of the energy band gap decreases the threshold carrier density. Namely, the large standard deviation "$\sigma_g$" of the spatial variation (fluctuation) of the energy band gap is advantageous. By contrast, if the threshold mode gain for one quantum well is more than 12 cm$^{-1}$, the decrease from 200 meV to 10 meV of the standard deviations "$\sigma_g$" of the spatial variation (fluctuation) of the energy band gap decreases the threshold carrier density.

Namely, the small standard deviation "$\sigma_g$" of the spatial variation (fluctuation) of the energy band gap is advantageous. The threshold mode gain for one quantum well depends on the internal loss, the reflectances of the cavity and the number of the quantum wells. The issue of advantage or disadvantage of the indium compositional fluctuation depends on those parameters in design of the laser device.

As described above, the indium compositional fluctuation is advantageous in reducing the transparent carrier density, but disadvantageous in reducing the differential gain. The advantage or disadvantage of the indium compositional fluctuation depends the threshold mode gain for one quantum well. The preferable degrees of the indium compositional fluctuation depend on the threshold mode gain for one quantum well.

In Applied Physics Letters, vol. 71, p. 2608, 1997, Chow et al reported a theoretical estimation on the effect of the indium compositional fluctuation to the characteristics or performances of the laser diode, however, provided that the indium compositional fluctuation makes the gain spectrum wide. They were silent on the important facts that the indium compositional fluctuation contributes to reduce the transparent carrier density. They addressed that the indium compositional fluctuation is the undesirable factor for providing the undesirable influence to the laser diode.

Under the condition that the indium-compositional fluctuation is the "macroscopic fluctuation" or the spatial scale of the compositional fluctuation is more than micron order, it is theoretically not inherent or not nature that the carriers are flown into the potential valleys provided by the potential fluctuations, and are localized and concentrated in the potential valleys, thereby causing inverted populations in localized areas corresponding to the potential valleys.

Under the different condition that the indium-compositional fluctuation is the "microscopic fluctuation" or the spatial scale of the compositional fluctuation is in the sub-micron order or smaller order or even that no compositional macroscopic fluctuation in the order of one micron or larger order is present, it is theoretically just inherent or nature that the carriers are flown into the potential valleys provided by the potential fluctuations, and are localized and concentrated in the potential valleys, thereby causing inverted populations in localized areas corresponding to the potential valleys. The compositional "microscopic fluctuation" contributes to improve the characteristic of the laser diode. Throughout the specification, the "compositional fluctuation" associated with the present invention is the "microscopic fluctuation" or the spatial variation in composition in the sub-micron order scale or small scale.

Figure 7:
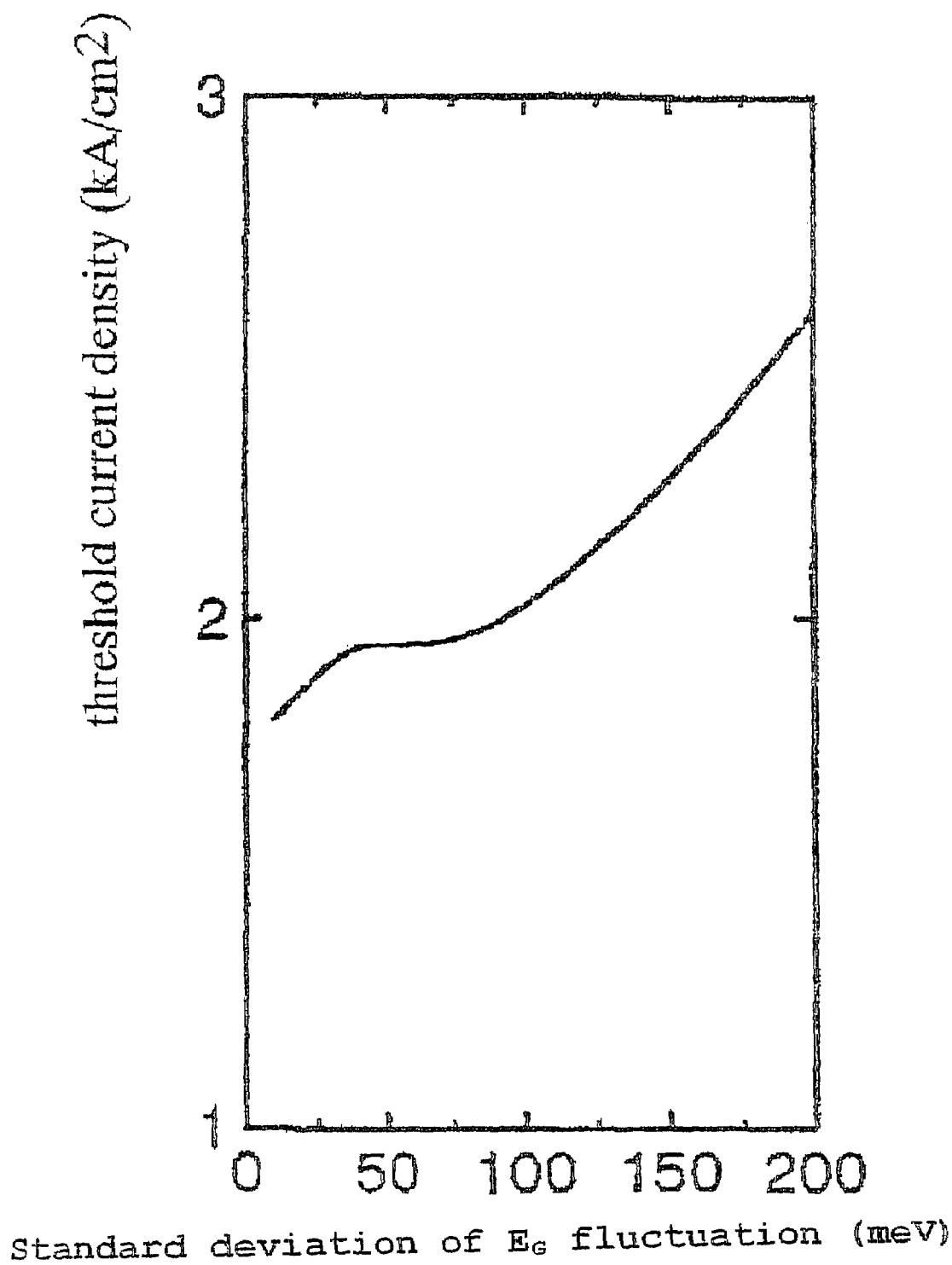
FIG. 7 is a diagram illustrative of a variation in differential gain over the standard deviation $\sigma_g$ of the "microscopic fluctuation" of the band gap energy profile, wherein the differential gain is theoretically calculated.
Figure 8:
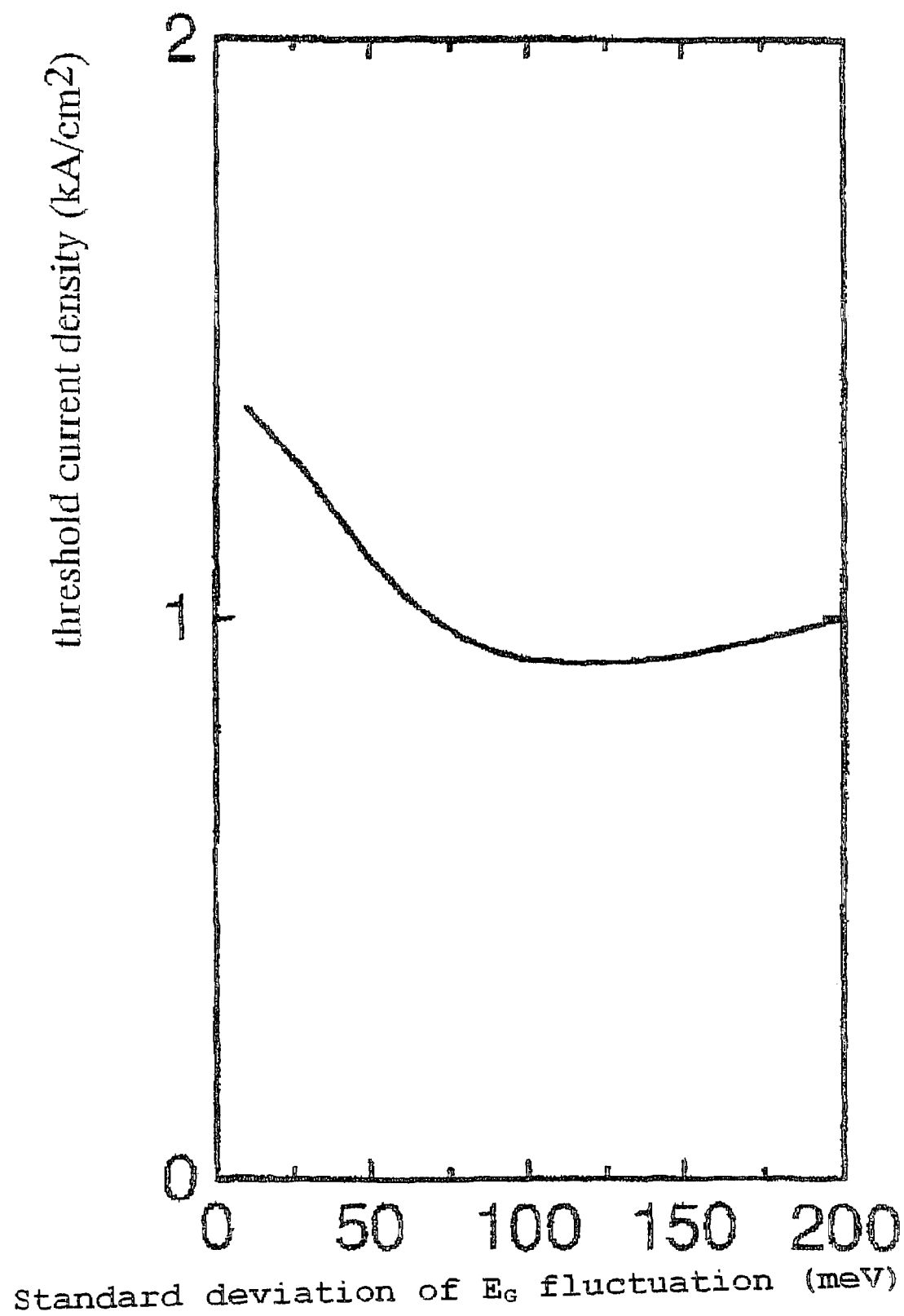
FIG. 8 is a diagram illustrative of variations in threshold current density of the laser device over the standard deviation "Eg" of the microscopic fluctuation of the energy band gap if both a light-emitting front facet and an opposite rear facet have high-reflectance coats.

FIG. 7 is a diagram illustrative of variations in threshold current density of the laser device over the standard deviation "Eg" of the microscopic fluctuation of the energy band gap if only a rear facet, which is opposite to a light-emitting front facet, has a high-reflectance coat. FIG. 8 is a diagram illustrative of variations in threshold current density of the laser device over the standard deviation "Eg" of the microscopic fluctuation of the energy band gap if both a light-emitting front facet and an opposite rear facet have high-reflectance coats.

In both FIGS. 7 and 8, the dependencies of the threshold current densities on the standard deviation "Eg" of the microscopic fluctuation of the energy band gap were calculated under the conditions that the number of the quantum wells is 3, and the internal loss is 15 cm$^{-1}$. In FIG. 7, the mirror loss is 20 cm$^{-1}$. In FIG. 8, the mirror loss is 1 cm$^{-1}$. The laser device of FIG. 7 will hereinafter be referred to as a single facet HR-coated laser device. The laser device of FIG. 8 will hereinafter be referred to as both facets HR-coated laser device. It is assumed that an optical confinement coefficient is 1% for the single quantum well. For the single facet HR-coated laser device of FIG. 7, the threshold mode gain for the single quantum well is about 14 cm$^{-1}$. For the both facets HR-coated laser device of FIG. 8, the threshold mode gain for the single quantum well is about 6 cm$^{-1}$.

As shown in FIG. 7, as the standard deviation "Eg" of the microscopic fluctuation of the energy band gap becomes large, the threshold current density simply increases. As the standard deviation "Eg" of the microscopic fluctuation of the energy band gap is small, then the threshold current density is also small. As the standard deviation "Eg" of the microscopic fluctuation of the energy band gap is not more than 40 meV, then a remarkable effect of reduction in the threshold current density of the single facet HR-coated laser device can be obtained.

As shown in FIG. 8, as the standard deviation "Eg" of the microscopic fluctuation of the energy band gap increases up to 75 meV, the threshold current density simply decreases. As the standard deviation "Eg" of the microscopic fluctuation of the energy band gap increases from 75 meV up to 200 meV, the threshold current density remains low and not more than 1 kA/cm$^2$. As the standard deviation "Eg" of the microscopic fluctuation of the energy band gap is in the range of 75 meV to 200 meV, then a remarkable effect of reduction in the threshold current density of the both facets HR-coated laser device can be obtained.

Under other conditions than described above and shown in FIGS. 7 and 8, it was shown, even illustrations are omitted, that if the threshold mode gain for the single quantum well is more than 12 cm$^{-1}$, the control of the standard deviation "Eg" to less than 40 meV of the microscopic fluctuation of the energy band gap reduces the threshold current density, whilst if the threshold mode gain for the single quantum well is less than 12 cm$^{-1}$, the control of the standard deviation "Eg" into the range of 75 meV to 200 meV of the microscopic fluctuation of the energy band gap reduces the threshold current density.

The threshold current density is proportional to the threshold carrier density. If the threshold mode gain for the single quantum well is more than 12 cm$^{-1}$, the control of the standard deviation "Eg" to less than 40 meV of the microscopic fluctuation of the energy band gap reduces the threshold carrier density. If the threshold mode gain for the single quantum well is less than 12 cm$^{-1}$, the control of the standard deviation "Eg" into the range of 75 meV to 200 meV of the microscopic fluctuation of the energy band gap reduces the threshold carrier density.

The above descriptions have been made based on the generally correct assumption that the threshold carrier density has the one-to-one correspondence to the threshold current density. In more precisely, it is not perfectly correct assumption that the threshold carrier density has the one-to-one correspondence to the threshold current density. In more precisely, it is the perfectly correct assumption that the threshold current density is proportional to [(the threshold carrier density)/(the carrier recombination life-time)]. Namely, the threshold current density depends on not only the threshold carrier density but also the carrier recombination life-time.

The following descriptions will be made under the perfectly correct assumption that the threshold current density is proportional to [(the threshold carrier density)/(the carrier recombination life-time)]. In case of nitride based semiconductor, the carrier recombination life-time may correspond mainly to the non-radiation recombination life-time. The increase of the non-radiation recombination life-time makes the carrier recombination life-time increase, thereby reducing the threshold current density.

Carriers are captured by valley portions of the "microscopic fluctuation" of the potential energy or the energy band gap, wherein the "microscopic fluctuation" of the potential energy or the band gap energy is provided by the "microscopic fluctuation" of the indium composition profile. The captured carriers in the valley portions are controlled to freely move from the valley portions over the potential barriers. This means that the probability of capturing the carriers into the defects or non-radiation centers is low, whereby the non-radiation recombination life-time is long. If, however, the carrier density increases even the fluctuation is large, the potential valleys are filled up with the carriers and excess carriers are over-flown from the potential valleys. The over-flown carriers are free to move, whereby the probability of capturing the carriers into the defects or non-radiation centers becomes high, whereby the non-radiation recombination life-time becomes short.

Figure 9:
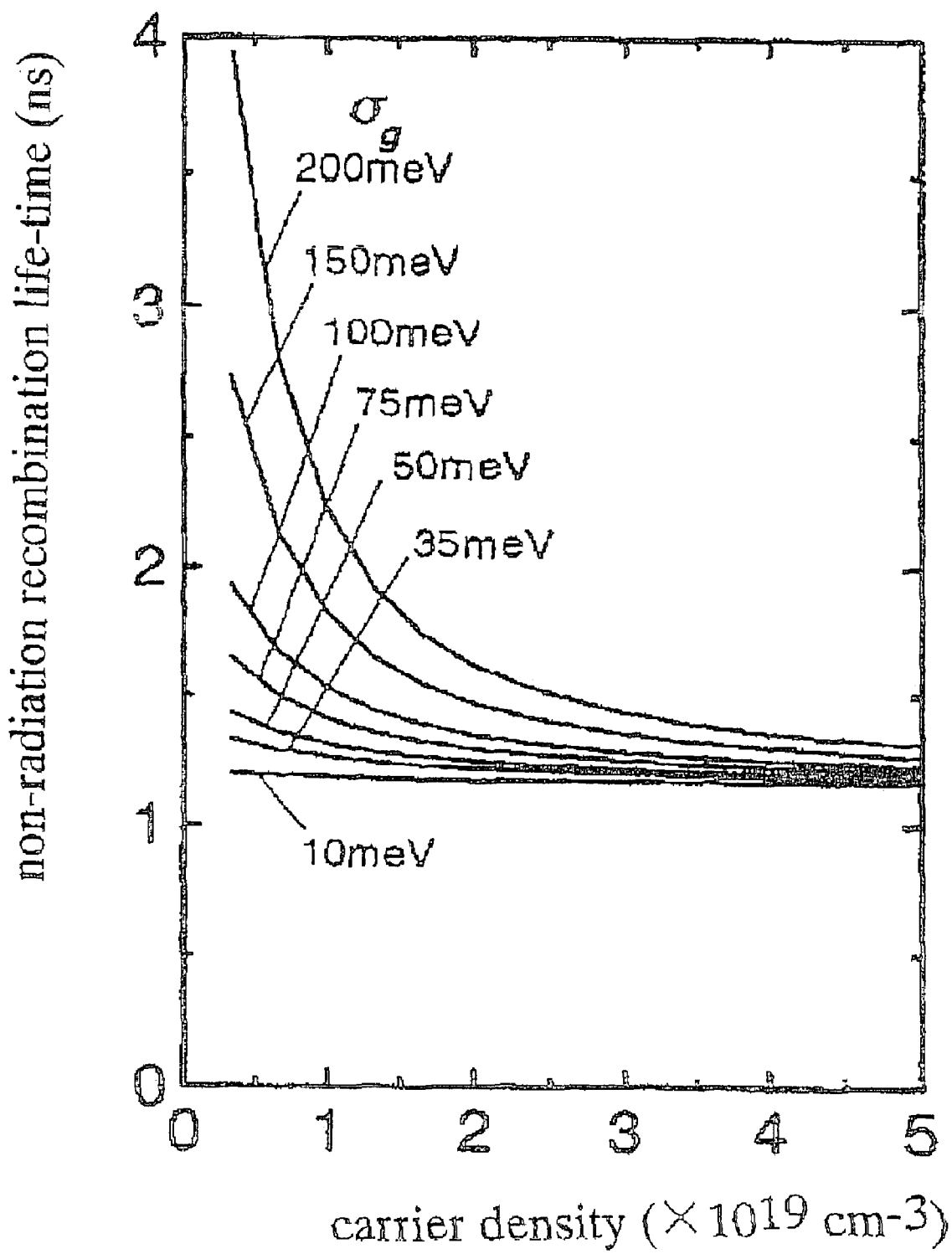
FIG. 9 is a diagram illustrative of respective variations in non-radiation recombination life-time over carrier density for standard deviations "$\sigma_g$" of various microscopic fluctuations from 10 meV to 200 meV.

FIG. 9 is a diagram illustrative of respective variations in non-radiation recombination life-time over carrier density for standard deviations "$\sigma_g$" of various microscopic fluctuations from 10 meV to 200 meV. In the range of the standard deviations "$\sigma_g$" of various microscopic fluctuation from 75 meV to 200 meV, if the carrier density is less than $1.5 \times 10^{19}$ cm$^{-3}$, the non-radiation recombination life-time is long. With reference again to FIG. 6, if the threshold mode gain is not more than 8 cm$^{-1}$ and if the standard deviations "$\sigma_g$" of various microscopic fluctuation is in the range from 75 meV to 200 meV, then the carrier density is not more than $1.5 \times 10^{19}$ cm$^{-3}$.

Accordingly, if the threshold mode gain for the single quantum well is not more than 12 cm$^{-1}$, the reduction of the threshold carrier density reduces the threshold current density. If the threshold mode gain for the single quantum well is not more than 8 cm$^{-1}$, an additional effect of increase in the carrier recombination life-time further contributes to reduce the threshold current density, whereby a remarkable reduction of the threshold current density can be obtained.

An inter-relationship between the threshold mode gain for the single quantum well and the structure of the laser device will be described. The threshold mode gain corresponds to the sum of the internal loss and the mirror loss. For the InGaN-based laser diode, the optical confinement coefficient for the single quantum well may be estimated about 1%. If the threshold mode gain of the single quantum well is larger than 12 cm$^{-1}$, the internal loss "$\alpha_i$" satisfies:

$$\alpha_i > 12 \times n - \alpha_m \text{ (cm}^{-1}\text{)}$$

where "$\alpha_m$" is a mirror loss, and "n" is the number of the quantum wells.

If the threshold mode gain of the single quantum well is equal to or smaller than 12 cm$^{-1}$, the internal loss "$\alpha_i$" satisfies:

$$\alpha_i \leq 12 \times n - \alpha_m \text{ (cm}^{-1}\text{)}.$$

If the threshold mode gain of the single quantum well is equal to or smaller than 8 cm$^{-1}$, the internal loss "$\alpha_i$" satisfies:

$$\alpha_i \leq 8 \times n - \alpha_m \text{ (cm}^{-1}\text{)}.$$

The threshold mode gain for the single quantum well may be linked through the internal loss to the slope efficiency. For the semiconductor laser diode emitting a light having a wavelength of 400 nanometers, a theoretical limitation of the slope efficiency is 3 (W/A). The actual slope efficiency is the product of 3 and a predetermined factor. The actual slope efficiency is given by:

$$S = 3 \times \{\alpha_m/(\alpha_i + \alpha_m)\} \times [\{(1-R_1)\sqrt{(R_2)}\}/\{(1-\sqrt{(R_1R_2)}) \times (\sqrt{(R_1)}+\sqrt{(R_2)})\}],$$

where "$R_1$" is a first reflectance of a first cavity facet, from which a light is emitted, "$R_2$" is a second reflectance of a second cavity facet opposite to said first cavity facet, "$\alpha_m$" is a mirror loss, and "n" is a number of said at least quantum well.

The above equation: $\alpha_i > 12 \times n - \alpha_m$ is incorporated into the above equation for the slope efficiency. The following equation is obtained.

$$S \leq 3 \times \{\alpha_m/(12 \times n)\} \times [\{(1-R_1)\sqrt{(R_2)}\}/\{(1-\sqrt{(R_1R_2)}) \times (\sqrt{(R_1)}+\sqrt{(R_2)})\}].$$

If the cavity length is not more than 1 millimeter, $S < 2.1/n$ (W/A).

From $\alpha_i \leq 12 \times n - \alpha_m$ (cm$^{-1}$), the following equation can be introduced.

$$S \geq 3 \times \{\alpha_m/(12 \times n)\} \times [\{(1-R_1)\sqrt{(R_2)}\}/\{(1-\sqrt{(R_1R_2)}) \times (\sqrt{(R_1)}+\sqrt{(R_2)})\}].$$

If the cavity length is not more than 200 millimeter, $S \geq 1.4/n$ (W/A).

The standard deviation of the microscopic fluctuation of the band gap energy may be converted to the standard deviation of the microscopic fluctuation of the indium composition or the standard deviation of the microscopic fluctuation of the differential gain. An inter-relationship between the standard deviation "$\Delta_x$" in the "microscopic fluctuation" of the indium composition of In$_x$Ga$_{1-x}$N and the standard deviation "$\sigma_g$" in the "microscopic fluctuation" of the energy band gap of In$_x$Ga$_{1-x}$N will be described. In Journal of Applied Physics vol. 46, p. 3432, 1975, Osamura et al. reported that the band gap energy "Eg" is given by:

$$Eg = 3.40(1-x) + 2.07x - 1.0x(1-x) \text{ (eV)}$$

If In$_x$Ga$_{1-x}$N is used for the active layer of a blue color laser diode, then x=approximately 0.15: x=approximately 0.1 to approximately 0.3. Under this condition, dE/dx=0.6 (eV). Thus, the interrelationship between the standard deviation "$\Delta_x$" and the standard deviation "$\sigma_g$" is given by:

$$\Delta_x = \sigma_g/0.6 \text{ (eV)}$$

What the standard deviation "$\sigma_g$" in the "microscopic fluctuation" of the energy band gap is not more than 40 meV means that the standard deviation "$\Delta_x$" in the "microscopic fluctuation" of the indium composition is not more than 0.067. What the standard deviation "$\sigma_g$" in the "microscopic fluctuation" of the energy band gap is in the range of 75 meV to 200 meV means that the standard deviation "$\Delta_x$" in the "microscopic fluctuation" of the indium composition is in the range of 0.125 to 0.333.

The above descriptions are commonly applicable to the device having the photo-luminescence layer of In$_x$Al$_y$Ga$_{1-x-y}$N (0<x<1, 0≤y≤0.2). Notwithstanding, it is particularly preferable that the photo-luminescence layer has a composition of In$_x$Al$_y$Ga$_{1-x-y}$N (0<x≤0.3, 0≤y≤0.05) or another composition of In$_x$Ga$_{1-x}$N (0<x≤0.3).

Further, the description will focus on the relationship between the standard deviation a of the "microscopic fluctuation" of the band gap energy profile of In$_x$Ga$_{1-x}$N and the differential gain of the laser device. Each of the "microscopic fluctuation" of the band gap energy profile and the "microscopic fluctuation" of the indium compositional profile has an inter-relationship with the differential gain.

Figure 10:
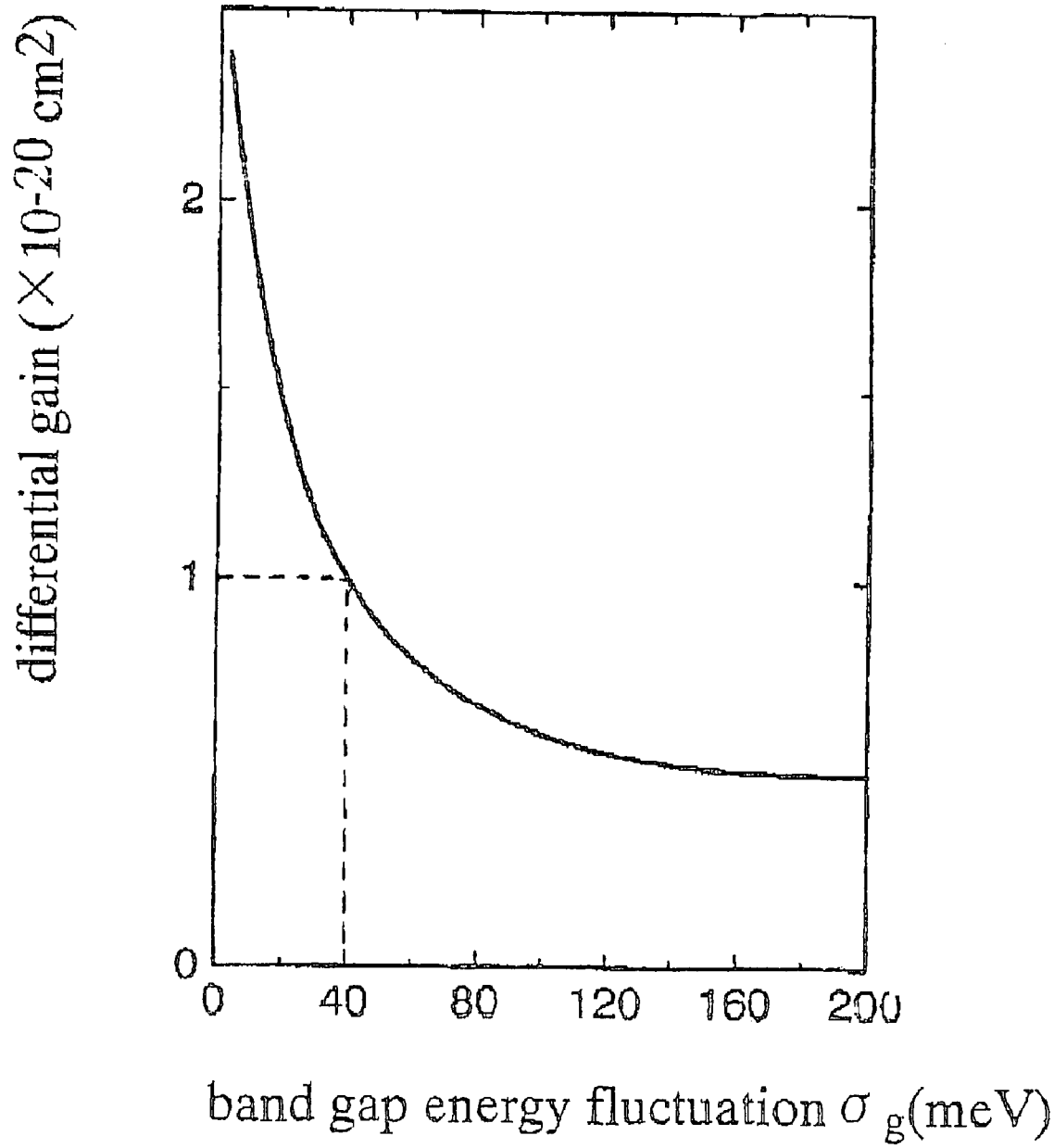
FIG. 10 is a diagram illustrative of a variation in differential gain over the standard deviation $\sigma_g$ of the "microscopic fluctuation" of the band gap energy profile, wherein the differential gain is theoretically calculated.

FIG. 10 is a diagram illustrative of a variation in differential gain over the standard deviation $\sigma^g$ of the "microscopic fluctuation" of the band gap energy profile, wherein the differential gain is theoretically calculated. As the standard deviation $\sigma_g$ of the "microscopic fluctuation" of the band gap energy profile is increased, then the differential gain is decreased. If the "microscopic fluctuation" of the band gap energy profile is large, then the density of state at the band edge is gently risen, whereby the gain saturation by the carrier injection is likely to be caused. As a result, a small differential gain is obtained. By contrast, if the "microscopic fluctuation" of the band gap energy profile is small, then the density of state of the step function based on the two-dimensionality of the quantum well is effective, whereby a large differential gain is obtained.

In FIG. 10, if the standard deviation $\sigma_g$ of the "microscopic fluctuation" of the band gap energy profile is 40 meV, then the differential gain is $1.0 \times 10^{-20}$ m$^2$ ($1.0 \times 10^{-16}$ cm$^2$). If the standard deviation $\sigma_g$ of the "microscopic fluctuation" of the band gap energy profile is not more than 40 meV, then this means that the differential gain is not less than $1.0 \times 10^{-20}$ m$^2$. If the standard deviation $\sigma_g$ of the "microscopic fluctuation" of the band gap energy profile is in the range of 75 meV to 200 meV, then this means that the differential gain is in the range of $0.5 \times 10^{-20}$ m$^2$ to $0.7 \times 10^{-20}$ m$^2$.

The descriptions will then focus on relationships of the present invention from the above decried first, second and third prior arts. The first prior art is disclosed in IEEE Journal Of Selected Topics In Quantum Electronics vol. 3, No. 3, June 1997. The second and third prior arts are disclosed in Japanese laid-open patent publication No. 11-340580.

In accordance with the present invention, a gallium nitride based material or sapphire is preferably selected for the substrate material for the purpose of defining the compositional profile of the active layer and defining the fluctuation of the band gap energy of the active layer. It is of course possible that silicon carbide is selected for the substrate material. This selection makes not easy to adjust the "microscopic fluctuation" of the compositional profile of the active layer.

Sapphire is larger in thermal expansion coefficient than the gallium nitride based materials. The gallium nitride based materials are larger in thermal expansion coefficient than silicon carbide. After the gallium nitride based semiconductor layer is formed over the silicon carbide substrate, then a cooling process is carried out, whereby tensile strains reside in the gallium nitride based semiconductor layer in a plan parallel to the surface of the substrate. If the silicon carbide substrate is used for the semiconductor laser device, then the tensile thermal strain resides in the active layer. The residual tensile strain makes it difficult to stably adjust the compositional fluctuation particularly the compositional microscopic fluctuation.

If the sapphire substrate is used for the semiconductor laser device, then only the compressive thermal strain resides in the gallium nitride based semiconductor layer in a plane parallel to the surface of the substrate. The semiconductor layer has a higher strength against the compressive strain than the tensile strain. Thus, it is relatively easy to stably adjust the compositional fluctuation. If GaN or AlGaN is selected for the substrate material, then the gallium nitride based semiconductor layer is similar in thermal expansion coefficient to the GaN or AlGaN substrate, for which reason almost no residual thermal strain is present in the gallium nitride based semiconductor layer. It is, therefore, easy to stably adjust the compositional fluctuation particularly the microscopic compositional fluctuation. For the above reasons, it is preferable to select gallium nitride based materials or sapphire for the substrate material.

Figure 3:
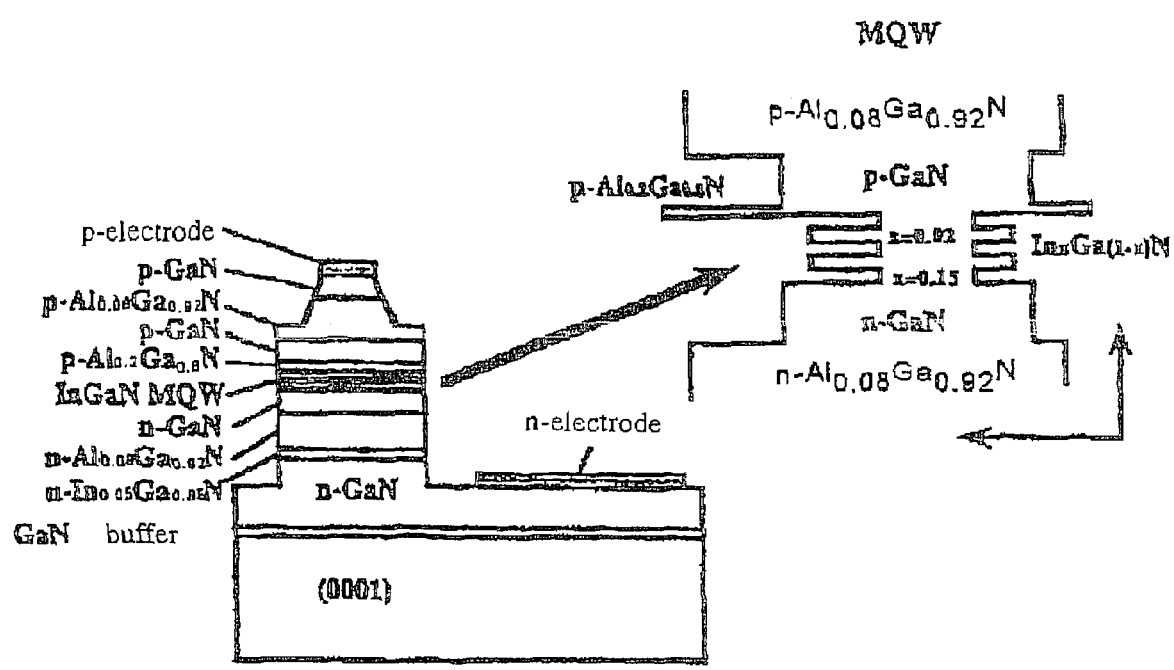
FIG. 3 is illustrative of an energy band gap profile of a multiple quantum well structure provided in a conventional gallium nitride based semiconductor laser device over sapphire substrate as the first prior art.

The present invention will be compared with the prior arts in view of the fluctuations and the gains. FIG. 3 is illustrative of an energy band gap profile of a multiple quantum well structure provided in a conventional gallium nitride based semiconductor laser device over sapphire substrate as the first prior art. A GaN buffer layer is provided on the sapphire substrate. An AlGaN cladding layer is provided over the GaN buffer layer. An InGaN quintuple quantum well active layer is provided over the AlGaN cladding layer.

The second and third prior arts relate to the gallium nitride based semiconductor laser devices provided over the silicon carbide substrates. The second prior art semiconductor laser device has a photo-luminescence wavelength distribution of about 150 meV of the active layer in the cavity. The third prior art semiconductor laser device has a reduced photo-luminescence wavelength distribution of about 90 meV of the active layer in the cavity. The reason for selecting silicon carbide to the substrate material is mentioned in the above Japanese publication as follows.

In a short wavelength semiconductor laser device, sapphire having a large lattice mismatch of 13% to the nitride based compound semiconductor is selected for the growth substrate, for which reason the density of dislocation in the active layer in the cavity is about $1 \times 10^{10}$ cm$^{-2}$. Notwithstanding, in the nitride based compound semiconductor, the prior art considered that the dislocation does not form non-luminescence center and does not provide any influence to the device performance. The prior arts do not consider the density of the dislocations in the active layer. Actually, however, the dislocation density has an inter-relationship with the compositional non-uniformity. As the dislocation density is decreased, then the compositional non-uniformity is also decreased. The use of the silicon carbide substrate largely reduces the lattice miss-match to about 3%. The large reduction in the lattice miss-match results in a reduction in the dislocation density into not more than $1 \times 10^9$ cm$^{-2}$ and at least to about $1 \times 10^7$ cm$^{-2}$. The short wavelength semiconductor laser device with the suppressed multiple wavelength emission is realized. The descriptions of this paragraph are of the second and third prior arts.

Figure 14:
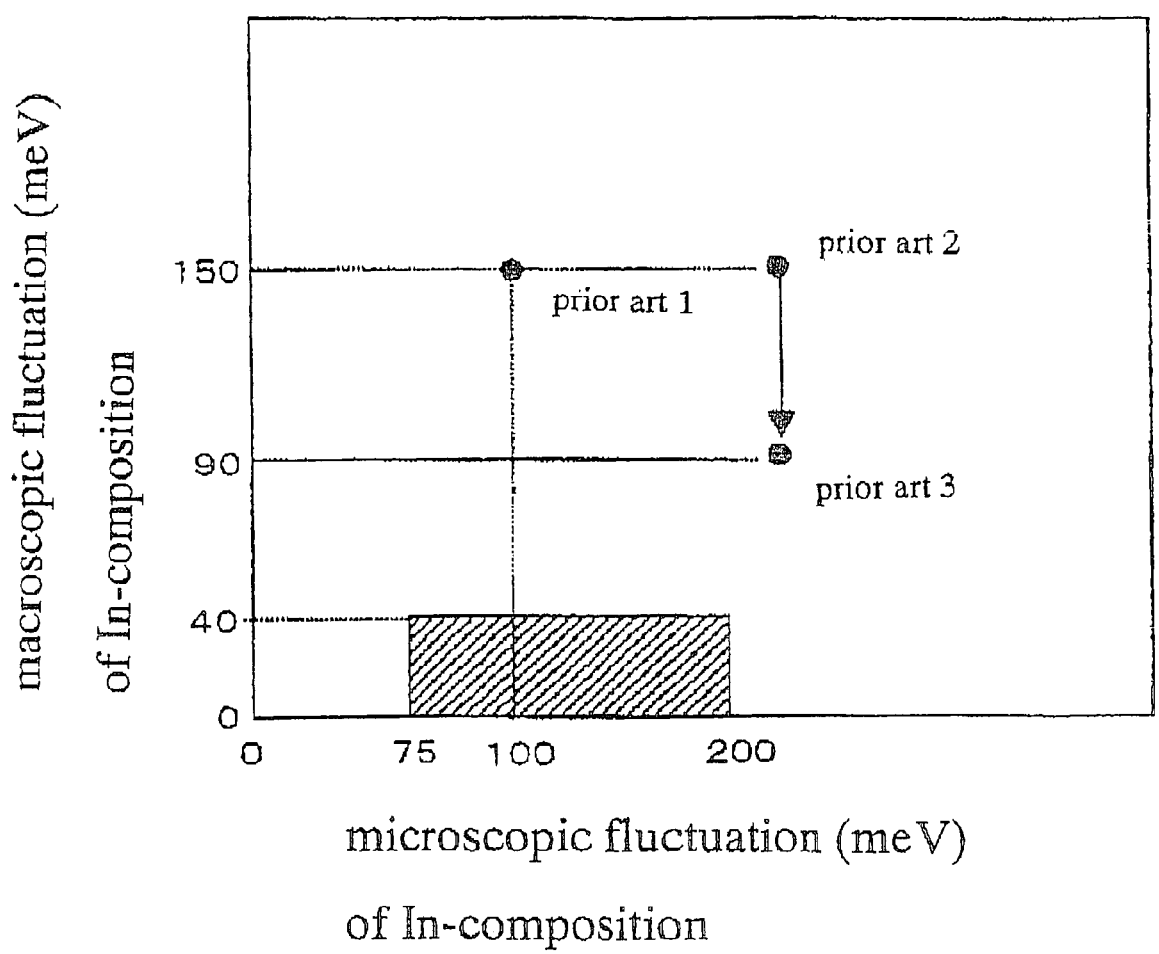
FIG. 14 is a diagram illustrative of relationships between the "macroscopic fluctuation" and "microscopic fluctuation" in the indium compositional profile for the first type semiconductor laser device for low output performance in accordance with the present invention, and the first to third prior arts.

FIG. 14 is a diagram illustrative of relationships between the "macroscopic fluctuation" and "microscopic fluctuation" in the indium compositional profile for the first type semiconductor laser device for low output performance in accordance with the present invention, and the first to third prior arts. The horizontal axis represents the "microscopic fluctuation" in the indium compositional profile in the sub-micron order scale. The vertical axis represents the "macroscopic fluctuation" in the indium compositional profile in the order of not less than 1 micrometer. A hatched region represents the first type semiconductor laser device for low output performance in accordance with the present invention. The first to third prior arts have larger "microscopic fluctuation" not less than 100 meV. The first prior art provides a differential gain of $5.8 \times 10^{-17}$ cm$^2$, which is converted to about 100 meV.

By contrast, in the first type semiconductor laser device for low output performance in accordance with the present invention, the "microscopic fluctuation" is not more than 40 meV. The first type semiconductor laser device for low output performance in accordance with the present invention is different from the first to third prior arts in that the "microscopic fluctuation" is reduced to not more than 40 meV and preferably not more than 20 meV.

Figure 15:
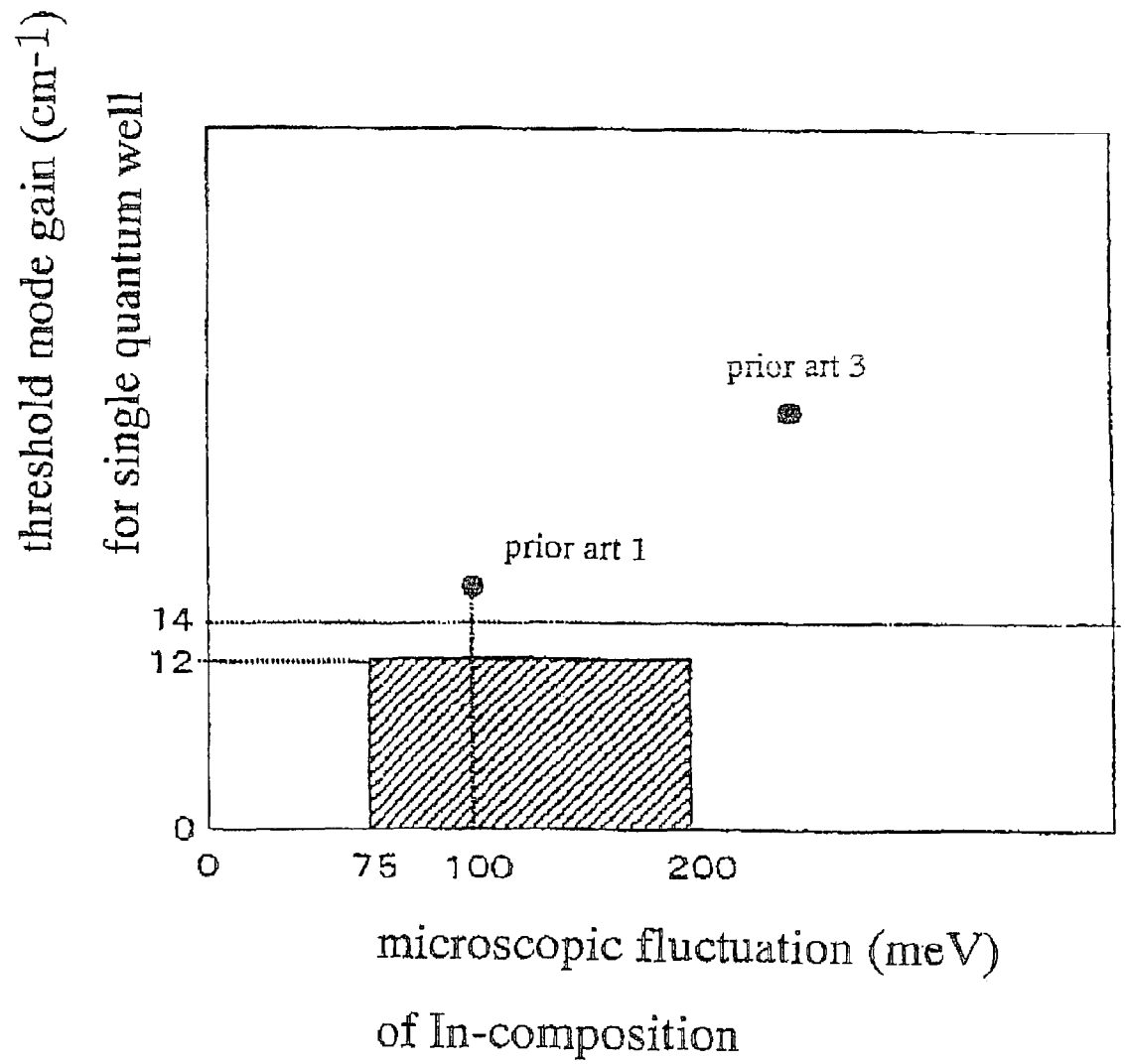
FIG. 15 is a diagram illustrative of relationships between the "threshold mode gain" for one quantum well and the "microscopic fluctuation" in the indium compositional profile for the first type semiconductor laser device for low output performance in accordance with the present invention, and the first and third prior arts.

FIG. 15 is a diagram illustrative of relationships between the "threshold mode gain" for one quantum well and the "microscopic fluctuation" in the indium compositional profile for the first type semiconductor laser device for low output performance in accordance with the present invention, and the first and third prior arts. The horizontal axis represents the "microscopic fluctuation" in the indium compositional profile in the sub-micron order scale. The vertical axis represents the "threshold mode gain" for one quantum well. A hatched region represents the first type semiconductor laser device for low output performance in accordance with the present invention.

The first and third prior arts have higher threshold mode gains than 14 cm$^{-1}$. The conventional gallium nitride based semiconductor laser devices of the prior arts generally have higher internal losses than about 40 cm$^{-1}$. If the number of the quantum wells is three or less, then the threshold mode gain for one quantum well is not less than 14 cm$^{-1}$ in consideration of the mirror losses. The first type semiconductor laser device for low output performance in accordance with the present invention is different from the first and third prior arts in that the threshold mode gain for one quantum well is reduced to not more than 12 cm$^{-1}$ and preferably not more than 8 cm$^{-1}$ with effective reduction of the internal loss.

Figure 16:
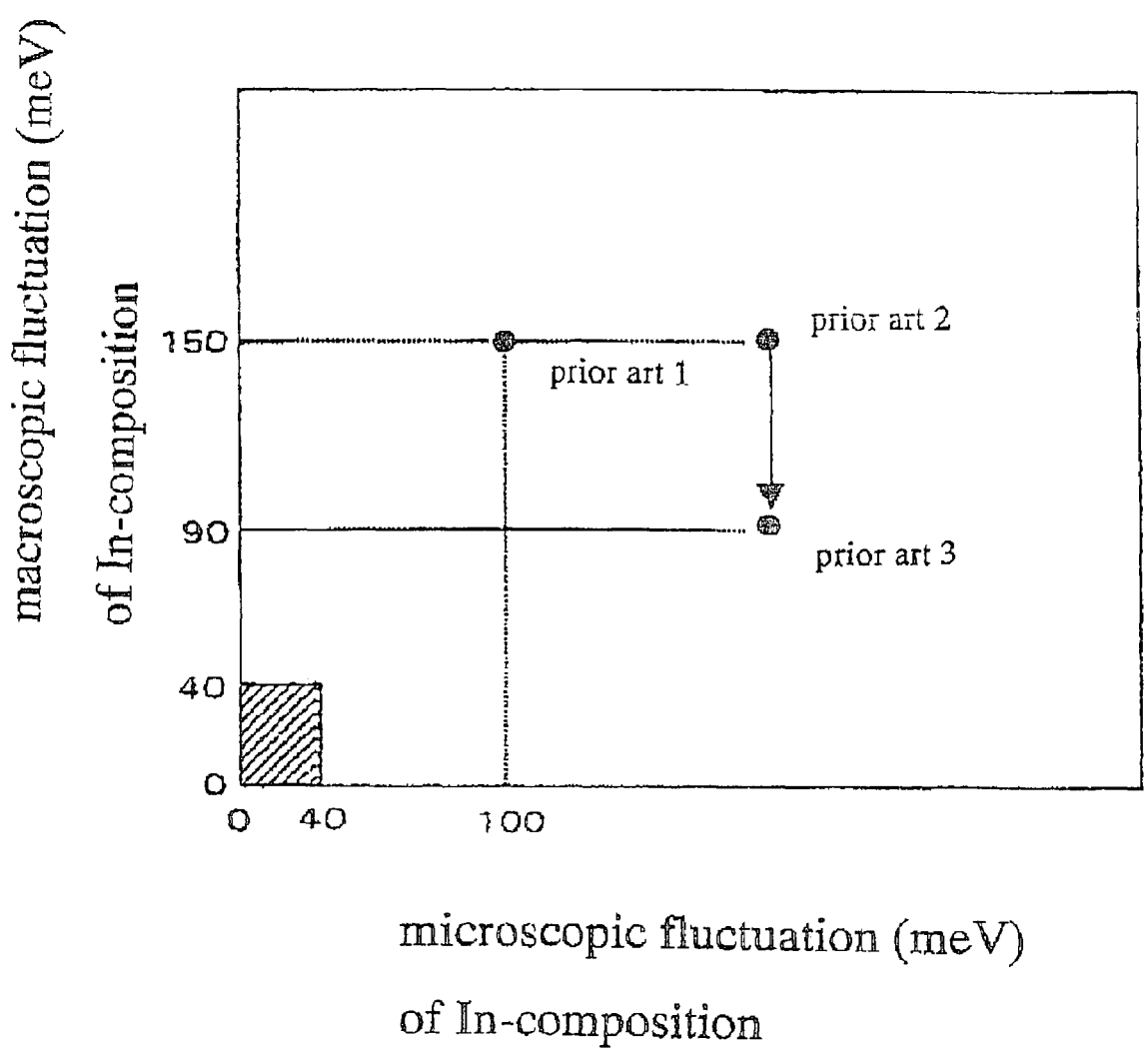
FIG. 16 is a diagram illustrative of relationships between the "macroscopic fluctuation" and "microscopic fluctuation" in the indium compositional profile for the second type semiconductor laser device for high output performance in accordance with the present invention, and the first to third prior arts.

FIG. 16 is a diagram illustrative of relationships between the "macroscopic fluctuation" and "microscopic fluctuation" in the indium compositional profile for the second type semiconductor laser device for high output performance in accordance with the present invention, and the first to third prior arts. The horizontal axis represents the "microscopic fluctuation" in the indium compositional profile in the sub-micron order scale. The vertical axis represents the "macroscopic fluctuation" in the indium compositional profile in the order of not less than 1 micrometer.

A hatched region represents the second type semiconductor laser device for high output performance in accordance with the present invention. The first to third prior arts have larger "microscopic fluctuation" not less than 100 meV The first prior art provides a differential gain of 5.8×10$^{-17}$ cm$^2$, which is converted to about 100 meV. By contrast, in the second type semiconductor laser device for high output performance in accordance with the present invention, both the "microscopic fluctuation" and the "macroscopic fluctuation" are not more than 40 meV. The second type semiconductor laser device for high output performance in accordance with the present invention is different from the first to third prior arts in that both the "microscopic fluctuation" and the "macroscopic fluctuation" are not more than 40 meV and preferably not more than 20 meV.

Figure 17:
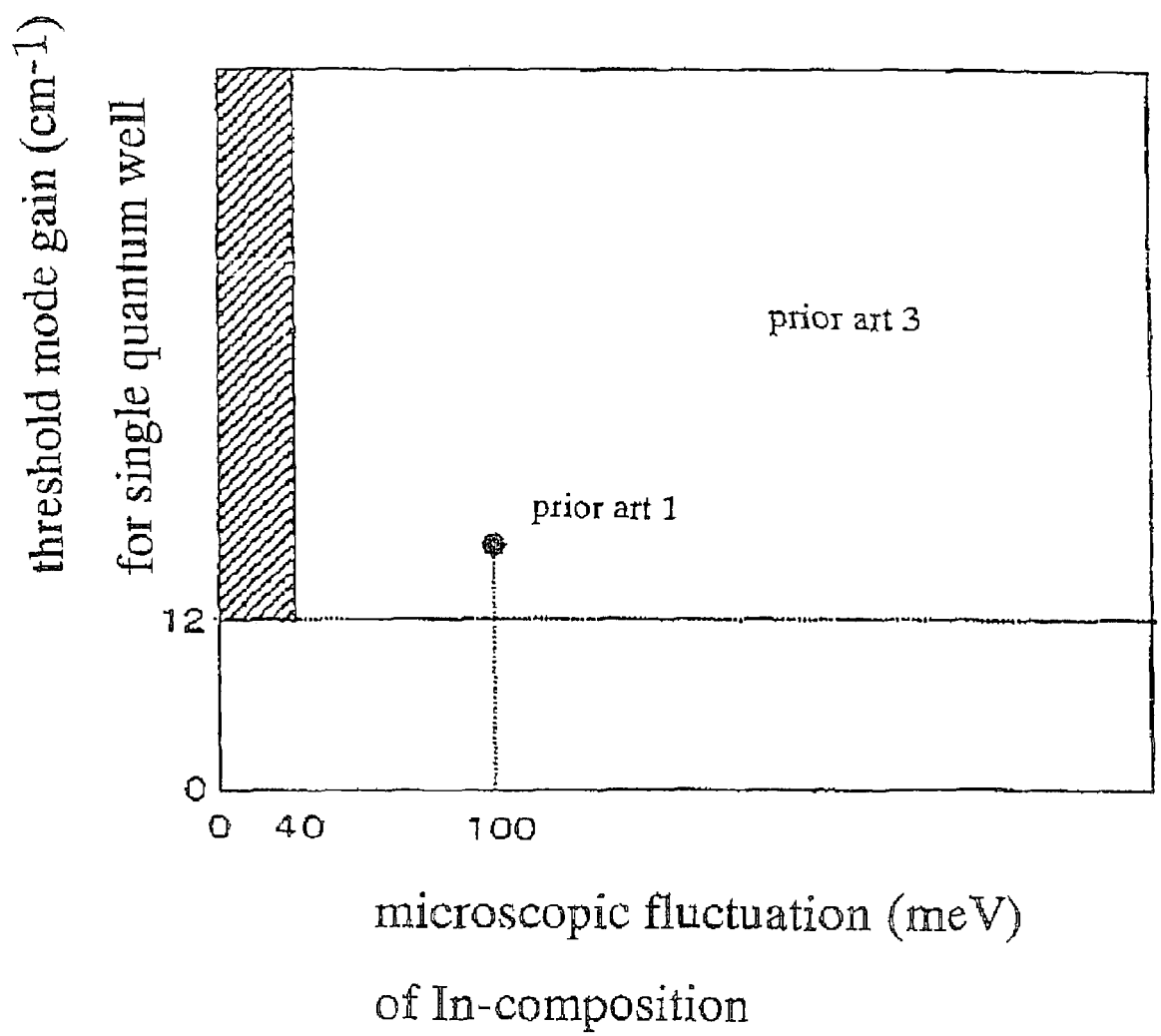
FIG. 17 is a diagram illustrative of relationships between the "threshold mode gain" for one quantum well and the "microscopic fluctuation" in the indium compositional profile for the second type semiconductor laser device for high output performance in accordance with the present invention, and the first and third prior arts.

FIG. 17 is a diagram illustrative of relationships between the "threshold mode gain" for one quantum well and the "microscopic fluctuation" in the indium compositional profile for the second type semiconductor laser device for high output performance in accordance with the present invention, and the first and third prior arts. The horizontal axis represents the "microscopic fluctuation" in the indium compositional profile in the sub-micron order scale. The vertical axis represents the "threshold mode gain" for one quantum well.

A hatched region represents the second type semiconductor laser device for high output performance in accordance with the present invention. The first to third prior arts have larger "microscopic fluctuation" not less than 100 meV. By contrast, in the second type semiconductor laser device for high output performance in accordance with the present invention, the "microscopic fluctuation" is not more than 40 meV. The second type semiconductor laser device for high output performance in accordance with the present invention is different from the first and third prior arts in that the "microscopic fluctuation" is not more than 40 meV and preferably not more than 20 meV.

For the present invention, it is important to reduce the "micro-fluctuations" in the indium composition profile and the band gap energy profile of the luminescent layer. The micro-photo-luminescent measurement is applicable to only the measurement to the "macroscopic fluctuations" but inapplicable to the measurement to the "microscopic fluctuations". In accordance with the present invention, the "microscopic fluctuation" is measured from the dependency on the photo-luminescence life-time.

Figure 11:
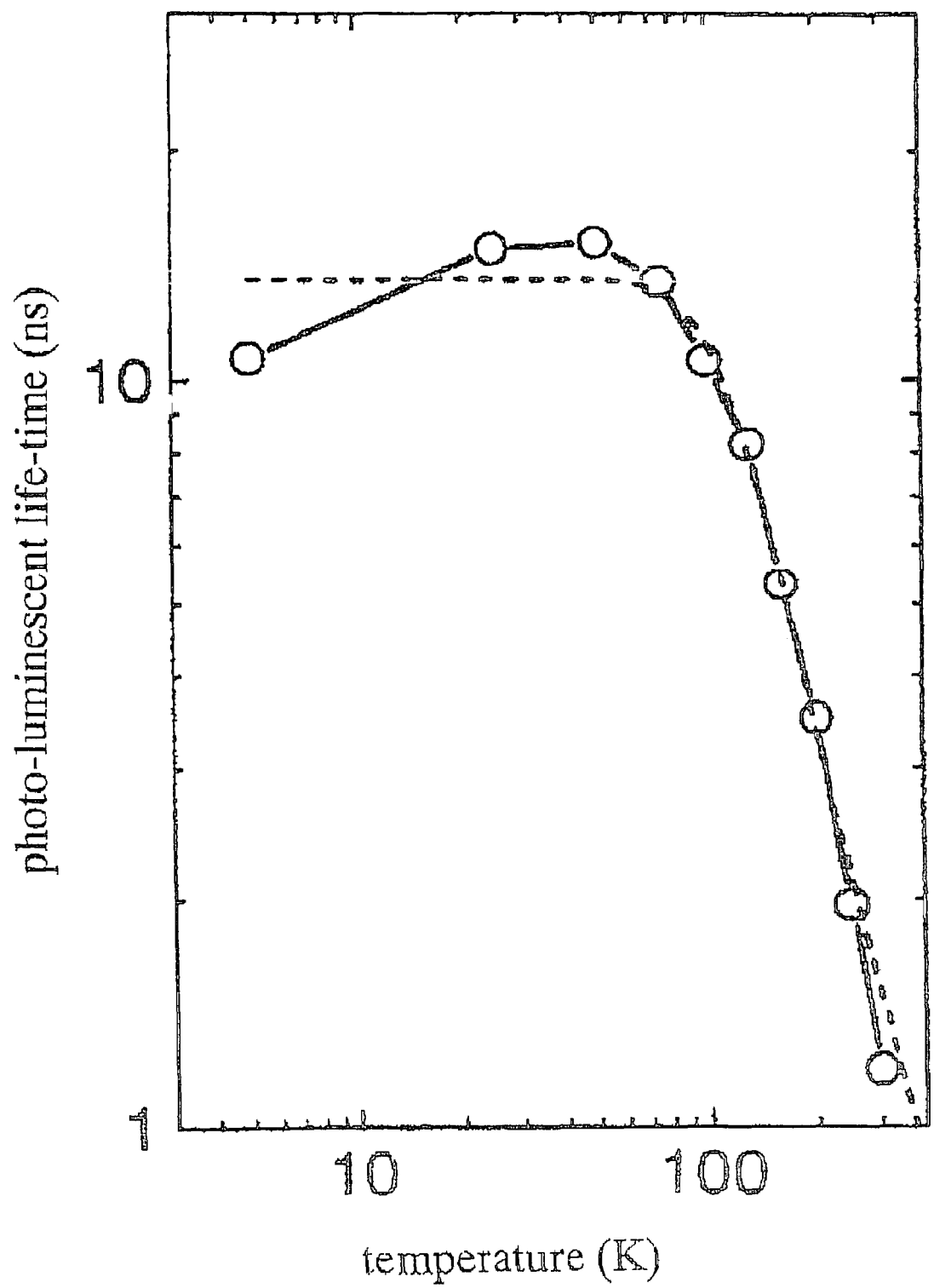
FIG. 11 is a diagram illustrative of variation in measured photo-luminescent life-time over temperature of the semiconductor laser device of FIG. 2.

The following measurement method was carried out to measure the "microscopic fluctuation" in the band gap energy profile due to the "microscopic fluctuation" in the indium composition of the InGaN quantum well layer as the luminescent layer provided in the InGaN quantum well laser device. FIG. 11 is a diagram illustrative of variation in measured photo-luminescent life-time over temperature of the semiconductor laser device of FIG. 2. The photo-luminescent life-time was measured as follows.

A light is irradiated onto a surface of the semiconductor laser device to cause an excitation of the laser, wherein the light comprises a secondary higher harmonic wave of a pico-second titanium sapphire laser, where the secondary higher harmonic wave has a wavelength of 370 nanometers, and an output of 5 mW and a cyclic frequency of 80 MHz. An emitted light from the semiconductor laser device is transmitted through lenses to a spectroscope, wherein a spectral light is then detected by a photo-multiplier, and a time resolution measurement is made by a single photon counting method. The time resolution measurement may also be made by use of a streak camera. The temperature varies in the range of 5K to 300K by a temperature-variable cryostat using a liquid helium.

The variation of the photo-luminescence over temperature has an inter-relationship with the standard deviation of the "microscopic fluctuation" of the band gap energy. Electrons excited by photons are captured by valley portions of the "microscopic fluctuation" of the potential energy or the band gap energy, wherein the "microscopic fluctuation" of the potential energy or the band gap energy is provided by the "microscopic fluctuation" of the indium composition profile. The captured electrons in the valley portions are inhibited to freely move from the valley portions over the potential barriers. This means that the probability of capturing the electrons into the defects or non-radiation centers is low, whereby the photo-luminescence life-time is long. If the temperature is increased, the captured electrons in the valley portions receive heat energy and thermally excited, and the thermally excited electors may be movable over the potential barriers of the "microscopic fluctuation" of the potential energy or the band gap energy. This means that the probability of capturing the electrons into the defects or non-radiation centers is high, whereby the photo-luminescence life-time is short.

FIG. 11 shows that if the temperature is increased from 100K, then the photo-luminescence life-time is made short rapidly. The curve of FIG. 11 is fitted with and represented by the following equation.

$$\tau_{PL}^{-1} = \tau_0^{-1} + AT^{1/2} \exp(-T_0/T) \quad (1)$$

where $\tau_{PL}$ is the photo-luminescence life-time, T is the temperature, $\tau_0$, A, and $T_0$ are fitting parameters. If the temperature is low, then the electrons remain captured in the valley portions of the potential having the "microscopic fluctuations", for which reason recombination appears depending on the intrinsic life-time $\tau_0$. At a low temperature, the second term of the above equation is ineffective and only the first term is effective. This means that the life-time is constant at $\tau_0$. As the temperature is increased, the thermal excitation of electrons is caused. Assuming that the potential barrier provided by the "microscopic fluctuation" is $kT_0$, where k is the Boltzmann's constant, a ratio of the excited carriers is proportional to $\exp(-T_0/T)$. The thermally excited carriers are movable over the potential barriers from the potential valleys provided by the "microscopic fluctuations" are then captured.

It is possible that the thermally excited carriers are captured in the defects or the non-radiation center. The probability of capturing the electrons is given by Nvs, where "N" is the density of the defects, "v" is the thermal velocity and "s" is the capture cross sectioned area. If the attention is drawn only onto the temperature dependency, then the thermal velocity is proportional to a square root of the temperature. Namely, $Nvs=AT^{1/2}$ is established. If the temperature is increased, the non-radiation recombination frequently appears based on the above mechanism. The recombination velocity of the carriers depends on $AT^{1/2}\exp(-T_0/T)$. Namely, the recombination velocity of the carriers is given by the second term of the above equation. The parameter $T_0$ is obtainable by the above fitting process. This parameter $T_0$ is an index parameter for the degree of the "microscopic fluctuation" of the indium component profile. For example, $T_0$ is 460K which is obtained from the fitting process based on FIG. 11.

The following descriptions will focus on the relationship between the parameter $T_0$ and the "microscopic fluctuation" of the band gap energy profile. "$kT_0$" corresponds to a thermal energy necessary for allowing electrons to freely move over the potential barriers provided by the "microscopic fluctuation" of the band gap energy profile. The "$kT_0$" is proportional to the "microscopic fluctuation" of the potential of the electrons distributed in the specific space.

If the "microscopic fluctuation" is processed by the potential of the electrons distributed in the two-dimensional space such as the quantum well, electrons having energies which are lower than a spatial-averaged potential value are localized and are not free to move over the potential barriers, whilst electrons having energies which are lower than the spatial-averaged potential value are free to move over the potential barriers. Those are deduced from the classical percolation theory. Thus, the "$kT_0$" may be considered to be a difference in energy level from the bottom of the valley portions to the averaged potential level.

Assuming that the spatial distribution of the potential energy is the normal distribution with a standard deviation $\sigma_e$, then the valley of the potential is lower in energy level by about $2\sigma_e$ than the averaged potential value, whereby $\sigma_e=0.5kT_0$ is derived. The standard deviation $\sigma_g$ of the "microscopic fluctuation" of the band gap energy of InGaN corresponds to a sum of the "microscopic fluctuation" in potential of the conduction band and the "microscopic fluctuation" in potential of the valence band. In Applied Physics Letters vol. 68, p. 2541, 1996, Martin et al. address that if a band off-set ratio of the conduction band and the valence band of the InGaN based compound semiconductor is 3:7, then $\sigma_g=3.33\ \sigma_e=1.67\ kT0$. The standard deviation $\sigma_g$ of the "microscopic fluctuation" of the band gap energy of InGaN is found from $T_0$ by use of the above equation. In case of FIG. 11, the standard deviation $\sigma_g$ of the "microscopic fluctuation" of the band gap energy is found to be a large value, for example, 66 meV.

Figure 2:
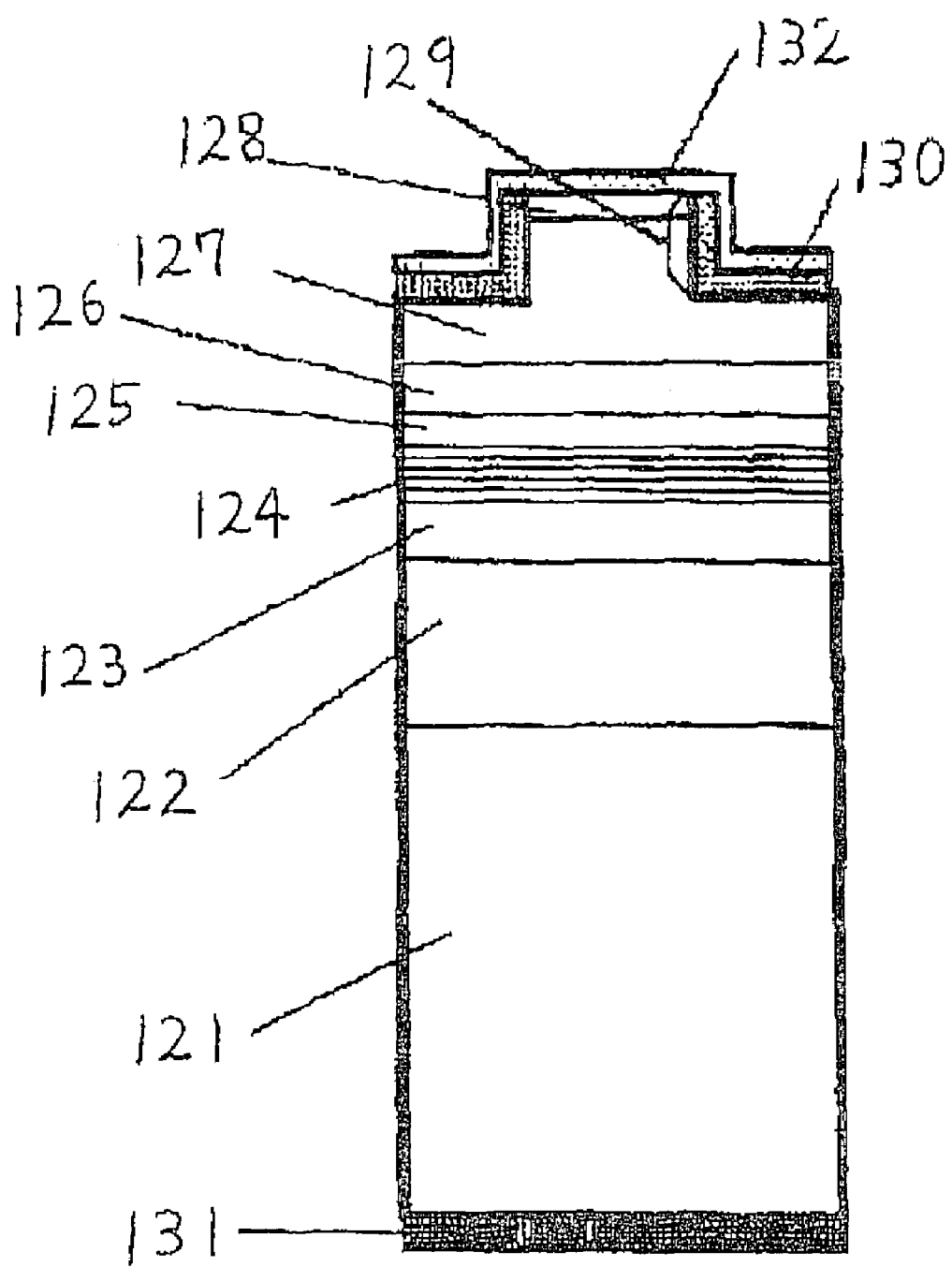
FIG. 2 is a fragmentary cross sectional elevation view of another conventional semiconductor laser device.

The micro-photo-luminescent measurement with a microbeam spot of a diameter of 1 micrometers to the semiconductor laser device shown in FIG. 2 was carried out. The distribution of the photo-luminescent peak wavelength is within the range of −1 nanometer to +1 nanometer, which corresponds to a range of −9 meV to +9 meV. The fluctuation of the indium composition profile in the scale over 1 micrometer could not be measured. Notwithstanding, the fluctuation the indium composition profile was measured by a different measurement method based on a temperature-dependency of the photo-luminescence life-time. This means that the fluctuation of the indium composition profile is the "microscopic fluctuation" of the sub-micron order scale which is not measurable by the photo-luminescence measurement.

In order to reduce the "macroscopic fluctuations" in the indium composition profile and the band gap profile of the active layer, it is effective to control the partial pressure of an ammonium gas, for example, not more than 110 hPa in the metal organic vapor phase epitaxy for forming at least the luminescent layer for the purpose of adjusting the growth rate. The control to the partial pressure of the ammonium gas suppresses the "macroscopic fluctuation" of the energy band gap within 20 meV. For controlling the "microscopic fluctuation" of the energy band gap within 75 meV to 200 meV in addition to the reduction of the "macroscopic fluctuations", it is effective to carry out a heat treatment at a relatively high temperature after the multilayer structure has been grown under the above control to the partial pressure of the ammonium gas.

A temperature of the heat treatment may be not less than 850° C., and preferably not less than 900° C., but not more than 1200° C. The necessary time for the heat treatment may generally be not less than 40 minutes. This heat treatment is carried out in order to form the "microscopic fluctuation" of the indium compositional profile. A low temperature gentle heat treatment, which may usually be used for forming an electrode, is not usable.

In accordance with the present invention, in order to reduce the internal loss, it is effective that a self confinement hetero-structure layer in a p-type electrode side comprises a non-doped layer, and that a growth temperature is kept high, for example, not less than 1100° C. In general, the self confinement hetero-structure layer in the p-type electrode side is doped with magnesium, resulting in crystal imperfection and formation of impurity level. These crystal imperfection and impurity level formation reduce the internal loss. In accordance with the present invention, in order to reduce the internal loss, the self confinement hetero-structure layer in the p-type electrode side is not doped and further the growth conditions are properly selected.

In accordance with the present invention, the photo-luminescence peak wavelength distribution is preferably not more than 40 meV and more preferably not more than 20 meV for the purpose of effectively reducing the threshold current. If the photo-luminescence peak wavelength distribution is ranged to be much higher value than 40 meV, then the threshold current is also high and the power consumption is also high.

In accordance with the present invention, the standard deviation of the "microscopic fluctuation" of the energy band gap of the luminescent layer is preferably in the range of 75 meV to 200 meV, and more preferably in the range of 80 meV to 150 meV, and further the standard deviation of the "microscopic fluctuation" of the indium compositional profile of the luminescent layer is preferably in the range of 0.125 to 0.333, and more preferably in the range of 0.133 to 0.266 for effectively reducing the threshold current of the laser device.

The base layer means a layer over which layers constituting the laser diode are provided. As described above, the base layer may comprise a crystal growth substrate of the gallium nitride based material such as GaN and AlGaN. Alternatively, the base layer may comprise a base layer provided over any substrate, for example, the semiconductor or semi-insulating substrate. For example, the semi-insulating substrate may comprise a sapphire substrate. The word "surface dislocation density" means a density of through dislocation on the surface of the layer. The base layer having the surface dislocation density of less than $1 \times 10^8$ cm$^{-2}$ may, for example, be obtained by either a facet-initiated epitaxial lateral over growth method or a pendio-epitaxy method.

The formation of the base layer in the facet-initiated epitaxial lateral over growth method may be made as follows. A thin GaN layer is formed over a sapphire substrate. Stripe-shaped $SiO_2$ masks are formed on the thin GaN layer. A selective lateral growth of the GaN layer from an opening portion of the stripe-shaped $SiO_2$ masks is carried out, so that the GaN layer has a reduced surface dislocation density, wherein extensions of dislocations are blocked by the $SiO_2$ masks and also changed in direction toward a lateral direction parallel to the surface of the substrate in the selective lateral growth. This facet-initiated epitaxial lateral over growth method is disclosed in 1999 Applied Physics vol. 68, 7, pp. 774-779.

The formation of the base layer in the pendio-epitaxy method may be made as follows. A low temperature buffer layer is formed over a substrate. A single crystal GaN layer is formed over the buffer layer. Etching masks are provided on the single crystal GaN layer. A selective etching to the single crystal GaN layer is carried out by use of the etching masks to form a stripe-shaped single crystal GaN pattern. A crystal growth from either a top surface or a side face of the stripe-shaped single crystal GaN pattern is made, thereby forming a base layer having a reduced surface dislocation density. This pendio-epitaxy method was reported by Tsvetankas. Zheleva et al. in MRS Internet J. Nitride Semiconductor Res. 4S1, G3 38 (1999).

The following method is also available to obtain the substrate having a further reduced dislocation density. A buffer layer is formed on the sapphire substrate. A gallium nitride based single crystal layer is formed on the buffer layer. The gallium nitride based single crystal layer is selectively etched to form gallium nitride based single crystal islands over the buffer layer. The gallium nitride based single crystal islands are used as seeds for crystal growth to form the base layer having the reduced surface dislocation density. In place of the selective etching process, growth conditions for the gallium nitride based single crystal layer may be selected to grow gallium nitride based single crystal islands over the buffer layer.

In accordance with the present invention, the surface dislocation density of the base layer is preferably less than $1 \times 10^8$ cm$^{-2}$, and more preferably $1 \times 10^7$ cm$^{-2}$. If the dislocation density of the base layer is much higher than $1 \times 10^8$ cm$^{-2}$, then it is difficult to realize the long life-time of the device even the "microscopic fluctuations" in the indium composition profile and the band gap energy profile are reduced and the differential gain is increased. If the dislocation density of the base layer is suppressed less than $1 \times 10^8$ cm$^{-2}$, particularly less than $1 \times 10^7$ cm$^{-2}$, a multiplier effect of the low dislocation density and the reduced "microscopic fluctuations" is obtained. This allows improvement in the life-time of the device with keeping the good device performances. The surface dislocation density is measurable by the known methods, for example, by measuring etch-pits of the layer or observation to a sectioned area of the layer by a transmission electron microscope. The base layer having the reduced dislocation density is obtainable by using the single crystal islands as seeds for the crystal growth. This substrate with the reduced dislocation density can be obtained by a single crystal growth from single crystal islands.

The base layer may comprise a low dislocation single crystal GaN layer grown over the substrate by the facet-initiated epitaxial lateral over growth. The base layer may also comprise a low dislocation single crystal AlGaN layer grown over the substrate by the facet-initiated epitaxial lateral over growth. The base layer may also comprise a low dislocation single crystal GaN layer grown over the substrate by the pendio-epitaxy method. The base layer may also comprise a low dislocation single crystal AlGaN layer grown over the substrate by the pendio-epitaxy method. The base layer may also comprise a low dislocation single crystal GaN layer grown by the crystal growth from the single crystal gallium nitride islands over the substrate. The base layer may also comprise a low dislocation single crystal GaN layer grown by the crystal growth from the single crystal aluminum gallium nitride islands over the substrate. The substrate may optionally be removed after the low dislocation single crystal GaN or AlGaN layer has been grown on the substrate. Since the base layer is of the low surface dislocation density, the base layer is not inclusive of a low temperature buffer layer deposited at a low temperature.

As described above, the base layer comprises one of the gallium nitride based materials such as AlGaN and GaN. The word "gallium nitride based material" means that any materials which include at least both nitrogen and gallium. The selection of any one of AlGaN and GaN for the base layer is preferable for improving both an optical confinement rate and the device life-time. In case of a gallium nitride based semiconductor laser diode, the cladding layer may be made of AlGaN, wherein it is preferable for obtaining a desired high optical confinement rate that a compositional ratio of aluminum in the cladding layer is high and also that a thickness of the cladding layer is thick.

If the semiconductor laser diode is applied to emit a laser beam having a luminescent wavelength in the range of 390-430 nanometers for the purpose of optical disk, it is preferable that the thickness of the cladding layer is 1 micrometer or more and the aluminum compositional ratio is not less than 0.05 and more preferably not less than 0.07. In this case, selection of GaN or AlGaN for the base layer is preferable, so as to make both thermal expansion coefficient and lattice constant similar between the base layer and the cladding layer, whereby a residual strain of the cladding layer is reduced as compared to when the base layer is different in material from the cladding layer.

The reduction in residual strain of the cladding layer is effective for preventing the deterioration of the active layer in the high temperature operation. The above selection of the material for the base layer also increases the available range of the thickness and the aluminum composition rate of the cladding layer, and also makes it easy to obtain a high optical confinement rate.

In order to realize the reductions in the "microscopic fluctuations" in the indium composition profile and the band gap energy profile of the luminescent layer and also to obtain the desired high differential gain, it is preferable to consider the growth conditions of the luminescent layer. As the ammonium gas partial pressure is decreased, then the obtainable differential gain is increased. In order to obtain the desirable high differential gain and also reduce the above "micro-fluctuations" in the indium composition profile and the band gap energy profile, it is preferable that the ammonium gas partial pressure is not less than the predetermined level, for example, 110 hPa and more preferably 95 hPa.

The threshold current depends on the number of the quantum wells, for which reasons it is preferable for the first type semiconductor laser device showing the low output performance that the number of the quantum wells is not more than three in view of reducing a threshold current for the purpose of possible reduction of the power consumption. This limitation in the number of the quantum wells allows a uniform carrier injection into the quantum wells. If the number of the quantum wells is large, for example, not less than 4, then it is likely to difficult to obtain the uniform hole injection into the quantum wells.

One or some of the quantum wells are insufficient in carrier density, whereby the internal losses are low. In Applied Physics vol. 73, 1998, pp. 2775-2777, Domen et al. reported that the carrier injections to the three quantum wells are uniform, but the carrier injections to the five quantum wells are not uniform.

The following descriptions will focus on the method of measuring the reflectance of the semiconductor laser diode. The reflectance "R" of the sample laser is given by $R=(n-1/n+1)^2$, where "n" is the refractive index of the semiconductor, provided that the semiconductor is simply cleaved without coating. It was known that the refractive index of GaN is about 2.553 if the wavelength of the laser beam is 400 nanometers. In this case, the reflectance "R" is 19%.

A dielectric multilayer structure may be usable for obtaining a highly reflective mirror, wherein the dielectric multilayer structure comprises alternating laminations of a high refractive index dielectric film and a low refractive index dielectric film. The reflectance "R" depends on the individual refractive indexes of the used materials, individual thickness of the films and the number of the laminated films. $TiO_2$ has a refractive index of 2.31. $SiO_2$ has a refractive index of 1.44.

Figure 13:
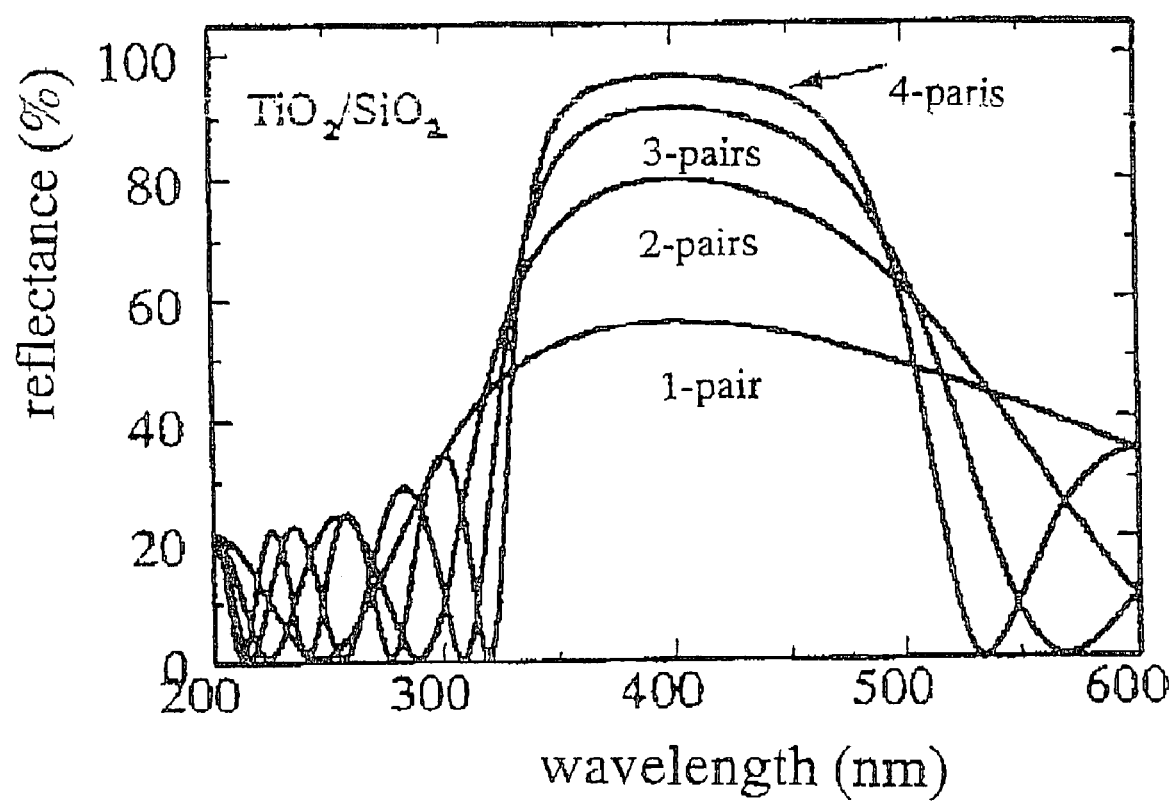
FIG. 13 is a diagram illustrative of reflective spectrums which represent variations in reflectance "R" over wavelength, wherein $SiO_2$ films and $TiO_2$ films are alternately laminated by one pair, two pairs, three pairs and four pairs, where the $SiO_2$ films and $TiO_2$ films have a thickness of 100 nanometers.

FIG. 13 is a diagram illustrative of reflective spectrums which represent variations in reflectance "R" over wavelength, wherein $SiO_2$ films and $TiO_2$ films are alternately laminated by one pair, two pairs, three pairs and four pairs, where the $SiO_2$ films and $TiO_2$ films have a thickness of 100 nanometers. The reflectance "R" comes large at a wavelength of about 400 nanometers. The reflectance "R" at a wavelength of about 400 nanometers depends on the number of pairs, namely on the number of the laminations. In case of the single pair of the $SiO_2$ film and $TiO_2$ film, the maximum value of the reflectance "R" is approximately 50%. In case of the two pair of the $SiO_2$ film and $TiO_2$ film, the maximum value of the reflectance "R" is approximately 80%.

In case of the three pair of the $SiO_2$ film and $TiO_2$ film, the maximum value of the reflectance "R" is approximately 90%. In case of the four pair of the $SiO_2$ film and $TiO_2$ film, the maximum value of the reflectance "R" is over 90%. The reflectance is calculated from the materials, thicknesses and the number of laminations.

There is another method of measuring the reflectance of the highly reflective coating, wherein the semiconductor laser diode is used. First and second outputs P1 and P2 from first and second reflectances R1 and R2 of the first and second facets of the semiconductor laser diode have a relationship given by $P1/P2=(1-R1)/(1-R2)\times(R2/R1)^{0.5}$. One of the first and second reflectances R1 and R2 is calculated from a ratio of P1/P2 and another of the first and second reflectances R1 and R2. If one of the first and second facets is uncoated, then the estimated reflectance of the uncoated facet is 19%. This method is effective to calculate the remaining reflectance of the coated facet.

The mirror loss can be obtained from the laser oscillation conditions and the above first and second reflectances R1 and R2. The mirror loss "αm" is given by $\alpha_m = 1/2L \times \ln(1/R1R2)$, where "L" is the cavity length. The mirror loss can be obtained from the reflectances and the length of the cavity.

Usually, the dielectric multilayer mirror such as alternating laminations of $SiO_2$ film and $TiO_2$ film is used for the highly reflective coat of the nitride based semiconductor laser diode, and the reflectance factor is not less than 80%. If the first and second facets are HR-coated, then a mirror loss is approximated to be 1 cm$^{-1}$. If one of the first and second facets is HR-coated and a cavity length is about 400 micrometers, then a mirror loss is approximated to be 20 cm$^{-1}$.

The internal loss "$\alpha_i$" can be investigated based on the current-output characteristics. If the semiconductor laser device having the first and second reflectances R1 and R2, an optical output "P1" from the first facet having the first reflectance R1 is given by:

$$P1=\{\alpha_m/(\alpha_i+\alpha_m)\}\times[\{(1-R1)\sqrt{(R2)}\}/\{(1-\sqrt{(R1R2)})\times(\sqrt{(R1)}+\sqrt{(R2)})\}]\times Vd\times(I-Ith)$$

where "I" is the current, "Ith" is the threshold current, "Vd" is the junction potential, "$\alpha_m$" is the mirror loss and "$\alpha_i$" is the internal loss. The junction potential "Vd" may be approximated to be almost equal to an optical energy corresponding to the oscillation wavelength. Therefore, the internal loss can be estimated by investigating the current-output characteristic if the reflectances and the mirror loss have been know.

The threshold mode gain can be obtained from the sum of the internal loss and the mirror loss, in view that the laser oscillation can be obtained when the gain and the loss are balanced to each other.

FIRST EXAMPLE

A first example according to the present invention will be described in detail with reference to the drawings. An n-GaN substrate with a low dislocation density was prepared by the above described facet-initiated epitaxial lateral over growth. The prepared substrate was made into contact with a phosphoric acid based solution to form etching-pits. The substrate was then measured in density of the etching-pits for measuring a surface dislocation density. It was confirmed that the measured surface dislocation density was $5.0 \times 10^7$ cm$^{-2}$.

Figure 12A:
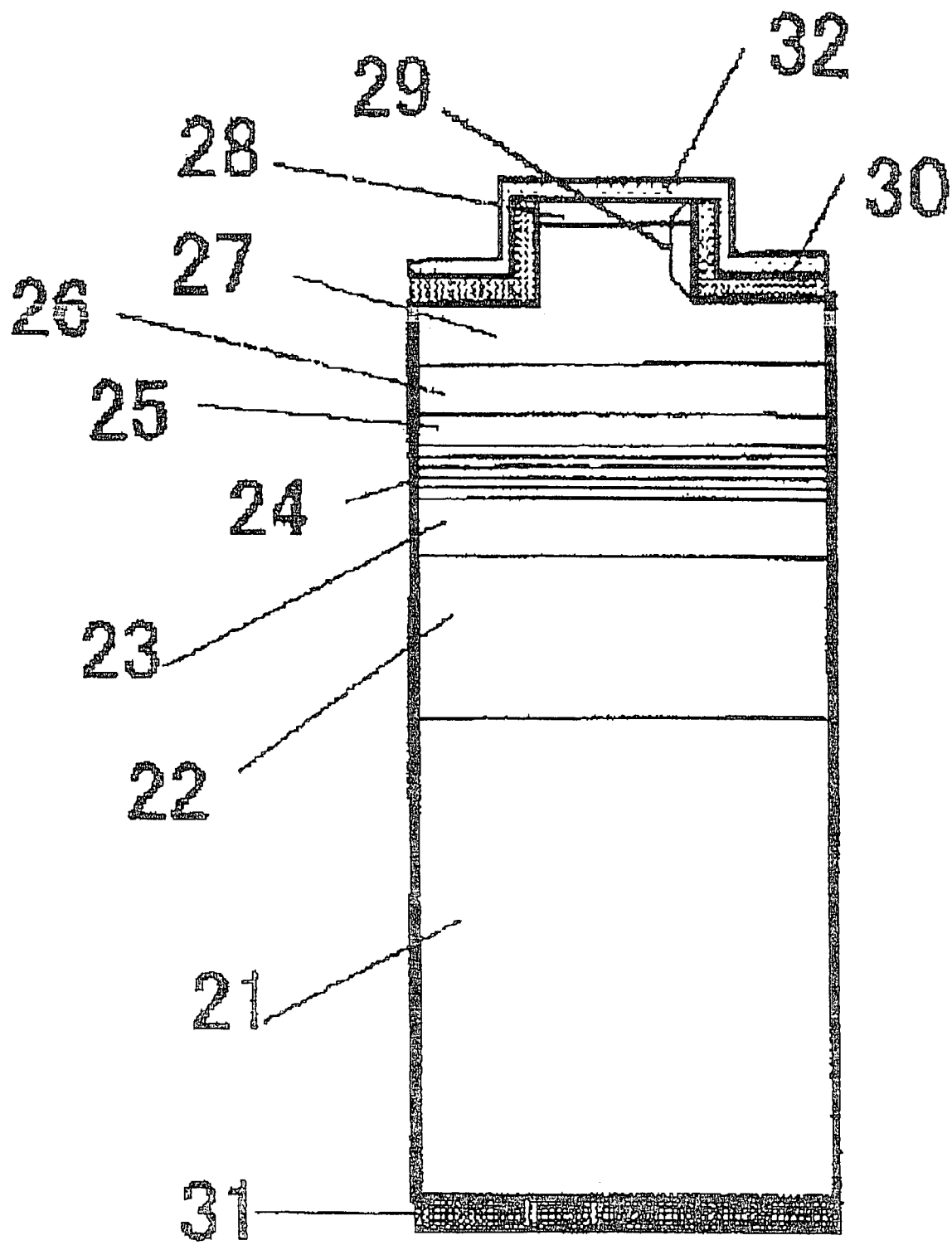
FIG. 12A is a cross sectional elevation view illustrative of a semiconductor laser diode in a first example in accordance with the present invention.

This n-GaN substrate with the low surface dislocation density was used for forming a gallium nitride based laser diode. FIG. 12A is a cross sectional elevation view illustrative of a semiconductor laser diode in a first example in accordance with the present invention. An n-type cladding layer 22 was formed on a top surface of the n-GaN substrate 21, wherein the n-type cladding layer 22 comprises an Si-doped n-type $Al_{0.1}Ga_{0.9}N$ layer having a silicon impurity concentration of $4 \times 10^{17}$ cm$^{-3}$ and a thickness of 1.2 micrometers. An n-type optical confinement layer 23 was formed on a top surface of the n-type cladding layer 22, wherein the n-type optical confinement layer 23 comprises an Si-doped n-type GaN layer having a silicon impurity concentration of $4 \times 10^{17}$ cm$^{-3}$ and a thickness of 0.1 micrometer.

A multiple quantum well active layer 24 was formed on a top surface of the n-type optical confinement layer 23, wherein the multiple quantum well active layer 24 comprises three $In_{0.2}Ga_{0.8}N$ well layers having a thickness of 4 nanometers and Si-doped $In_{0.05}Ga_{0.95}N$ potential barrier layers having a silicon impurity concentration of $5 \times 10^{18}$ cm$^{-3}$ and a thickness of 5 nanometers. A cap layer 25 was formed on a top surface of the multiple quantum well active layer 24, wherein the cap layer 25 comprises an Mg-doped p-type $Al_{0.2}Ga_{0.8}N$ layer. An undoped optical confinement layer 26 was formed on a top surface of the cap layer 25, wherein the undoped optical confinement layer 26 comprises an undoped GaN layer having a thickness of 0.1 micrometer. A p-type cladding layer 27 was formed on a top surface of the undoped optical confinement layer 26, wherein the p-type cladding layer 27 comprises an Mg-doped p-type $Al_{0.1}Ga_{0.9}N$ layer having a magnesium impurity concentration of $2 \times 10^{17}$ cm$^{-3}$ and a thickness of 0.5 micrometers.

A p-type contact layer 28 was formed on a top surface of the p-type cladding layer 27, wherein the p-type contact layer 28 comprises an Mg-doped p-type GaN layer having a magnesium impurity concentration of $2 \times 10^{17}$ cm$^{-3}$ and a thickness of 0.1 micrometer.

Those layers 22, 23, 24, 25, 26, 27, and 28 were formed by a low pressure metal organic vapor phase epitaxy method under a pressure of 200 hPa. A partial pressure of the ammonium gas for nitrogen source was maintained at 53 hPa. TMG was used for the Ga source material. TMA was used for the Al source material. TMI was used for the In source material. The growth temperature was maintained at 1050° C. except when the InGaN multiple quantum well active layer 24 and the undoped optical confinement layer 26 were grown. In the growth of the InGaN multiple quantum well active layer 24, the growth temperature was maintained at 780° C. In the growth of the undoped optical confinement layer 26, the growth temperature was maintained at 1150° C.

After the formed structure was subjected to a heat treatment at 900° C. for 1 hour, a dry etching process was then carried out to selectively etch the p-type cladding layer 27 and the p-type contact layer 28 thereby forming a mesa structure 29. A silicon dioxide film 30 was formed on the mesa structure 29 and the upper surfaces of the p-type contact layer 28. The silicon dioxide film 30 was selectively removed from the top surface of the mesa structure 29 by use of an exposure technique, whereby the top surface of the p-type contact layer 28 was shown and a ridged structure was formed. An n-type electrode 31 was formed on a bottom surface of the substrate 21, wherein the n-type electrode 31 comprises laminations of a titanium layer and an aluminum layer.

A p-type electrode 32 was formed on a top surface of the p-type contact layer 28, wherein the p-type electrode 32 comprises laminations of a nickel layer and a gold layer. The above structure was then cleaved to form first and second facets which defines a cavity length of 300 micrometers. Both the first and second facets were then coated with a highly reflective coat of a reflectance factor of 80%, wherein the highly reflective coat comprises laminations of titanium dioxide film and silicon dioxide film.

For the method of forming the above laser device, the following three points are important. First, the multi-layered structure was grown under the condition of the low partial pressure of ammonium. Second, a heat treatment was then carried out at about 900° C. for one hour after the multi-layered structure had been grown. Third, the GaN optical confinement layer 26 was undoped and its growth temperature was high, for example, 1150° C.

The first important point is to reduce both the "microscopic fluctuation" and the "macroscopic fluctuation" in the composition of the quantum wells in the active layer. The present inventors discovered that after the quantum wells having the small "microscopic fluctuation" and the small "macroscopic fluctuation" has been grown, then the high temperature heat treatment is carried out thereby to cause that only the "microscopic fluctuation" becomes large whilst the "macroscopic fluctuation" remains small. The present inventors also discovered that an optical absorption into the GaN optical confinement layer is the main cause for the internal loss. In order to reduce the optical absorption into the GaN optical confinement layer, it is effective to improve the crystal quality. To improve the crystal quality, it is effective to increase the growth temperature of the GaN optical confinement layer. In addition, in order to reduce the optical absorption through the impurity level, Mg is not doped into the GaN optical confinement layer.

It was confirmed that the semiconductor laser device exhibits the following characteristics. The usage of the semiconductor laser device is the low output laser diode. The number of the quantum wells is 3. The cavity length was 300 micrometers. The threshold mode gain for the single quantum well is 6.5 cm$^{-1}$. The first mirror reflectance of the first facet with HR-coat, from which the light is emitted, is 80%. The second mirror reflectance of the second facet with HR-coat opposite to the first facet is also 80%. The mirror loss is 7.4 cm$^{-1}$. The internal loss is 12 cm$^{-1}$. The slope efficiency is 0.57 (W/A). The standard deviation of the microscopic fluctuation of the indium composition is 0.167. The standard deviation of the microscopic fluctuation of the band gap energy is 100 meV. The differential gain "dg/dN" is $0.6 \times 10^{-20}$ m$^2$. The threshold current density is 0.8 (kA/cm$^2$). The photo-luminescence peak wavelength distribution is within 19 meV. The threshold current is sufficiently low.

The "macroscopic fluctuation" in the indium composition was measured by the microscopic photo-luminescence measurement with the resolving power of 1 micrometer. It was confirmed that the photo-luminescent wavelength distribution was not more than 20 meV.

Further, the "microscopic fluctuation" in the indium composition was measured by the relaxation frequency measurement which measures the differential gain. It was confirmed that the "microscopic fluctuation" was 100 meV.

Figure 18:
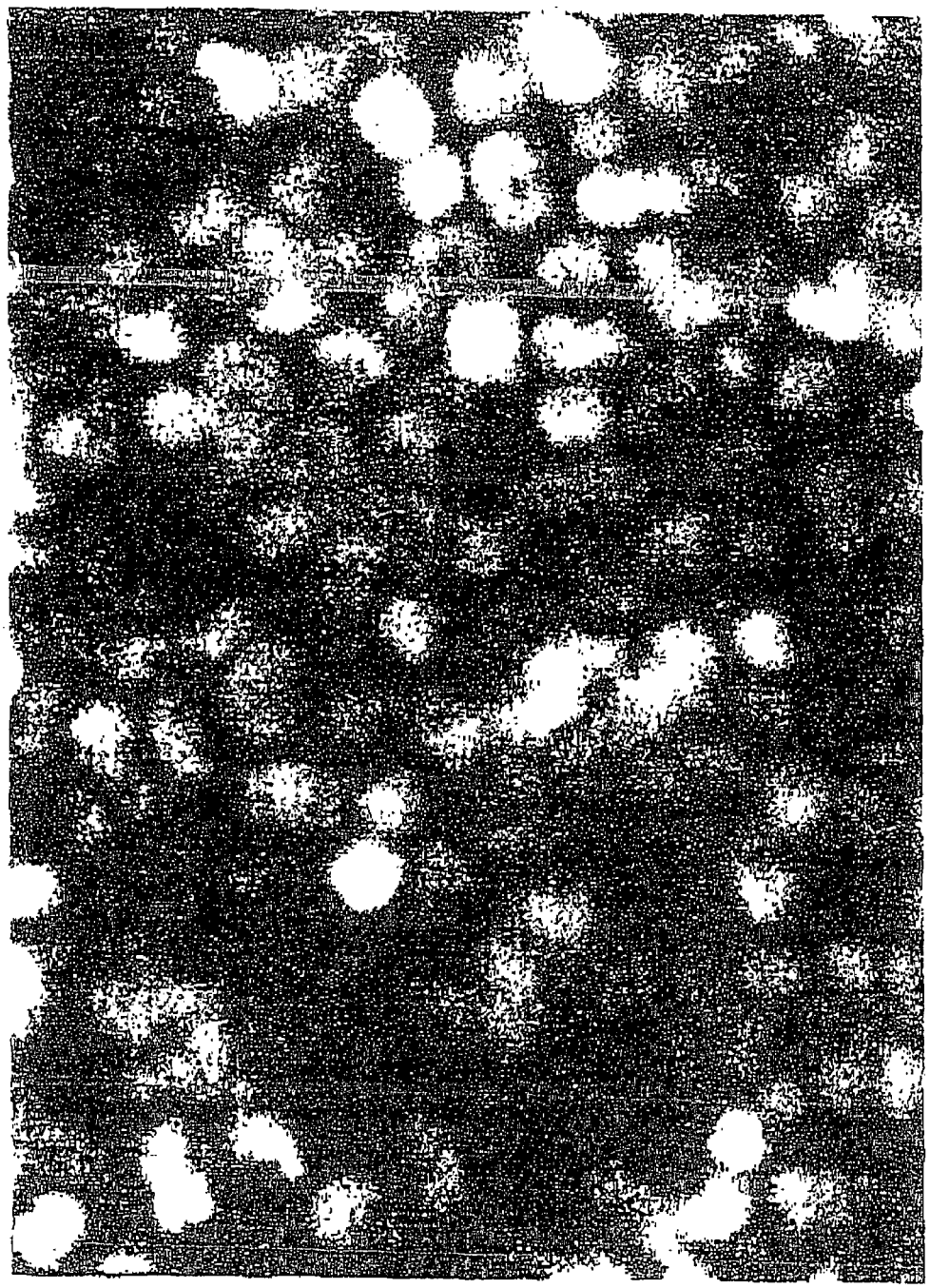
FIG. 18 is a photograph of the cathode luminescence image in example 1 of the present invention.

Furthermore, the "microscopic fluctuation" in the indium composition was measured by observation of cathode luminescence. In the cathode luminescence observation, after the cap layer was formed over the multiple quantum well active layer, the growth process was discontinued to form evaluation-purpose samples. Electron beams are irradiated onto the evaluation-purpose samples with concurrent spectroscope for conducting mapping process at a predetermined wavelength, at an acceleration voltage of 3 kV and at room temperature. The cathode luminescence was observed in the range of 400-500 nanometers. FIG. 18 is a photograph of the cathode luminescence image in example 1 of the present invention. As a result, it was confirmed that the samples of the example 1 of the present invention are free of the "macroscopic fluctuation" but have the "microscopic fluctuation".

SECOND EXAMPLE

A second example according to the present invention will be described in detail with reference to the drawings. An n-GaN substrate with a low dislocation density was prepared by the above described facet-initiated epitaxial lateral over growth. The prepared substrate was made into contact with a phosphoric acid based solution to form etching-pits. The substrate was then measured in density of the etching-pits for measuring a surface dislocation density. It was confirmed that the measured surface dislocation density was $5.0 \times 10^7$ cm$^{-2}$. The laser device of this second example is different from the first example in the high output performance and the single quantum well active layer.

Figure 12B:
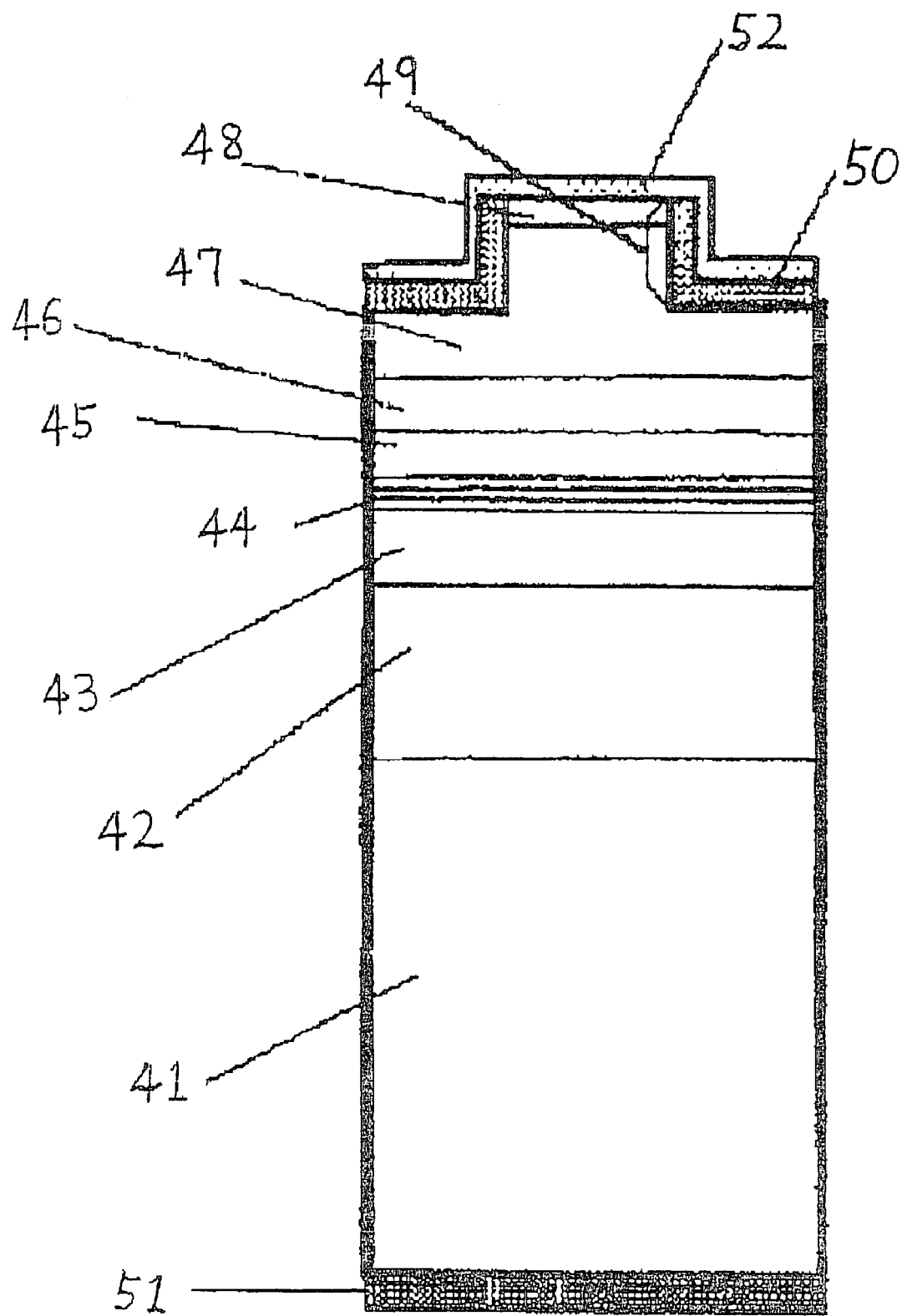
FIG. 12B is a cross sectional elevation view illustrative of a semiconductor laser diode in a second example in accordance with the present invention.

This n-GaN substrate with the low surface dislocation density was used for forming a gallium nitride based laser diode. FIG. 12B is a cross sectional elevation view illustrative of a semiconductor laser diode in a second example in accordance with the present invention. An n-type cladding layer 42 was formed on a top surface of the n-GaN substrate 41, wherein the n-type cladding layer 42 comprises an Si-doped n-type $Al_{0.1}Ga_{0.9}N$ layer having a silicon impurity concentration of $4 \times 10^{17}$ cm$^{-3}$ and a thickness of 1.2 micrometers. An n-type optical confinement layer 43 was formed on a top surface of the n-type cladding layer 42, wherein the n-type optical confinement layer 43 comprises an Si-doped n-type GaN layer having a silicon impurity concentration of $4 \times 10^{17}$ cm$^{-3}$ and a thickness of 0.1 micrometer.

A single quantum well active layer 44 was formed on a top surface of the n-type optical confinement layer 43, wherein the single quantum well active layer 44 comprises a single $In_{0.2}Ga_{0.8}N$ well layer having a thickness of 3 nanometers and Si-doped $In_{0.05}Ga_{0.95}N$ potential barrier layers having a silicon impurity concentration of $5 \times 10^{18}$ cm$^{-3}$ and a thickness of 5 nanometers. A cap layer 45 was formed on a top surface of the multiple quantum well active layer 44, wherein the cap layer 45 comprises an Mg-doped p-type $Al_{0.2}Ga_{0.8}N$ layer.

An undoped optical confinement layer 46 was formed on a top surface of the cap layer 45, wherein the undoped optical confinement layer 46 comprises an undoped GaN layer having a thickness of 0.1 micrometer. A p-type cladding layer 47 was formed on a top surface of the undoped optical confinement layer 46, wherein the p-type cladding layer 47 comprises an Mg-doped p-type $Al_{0.1}Ga_{0.9}N$ layer having a magnesium impurity concentration of $2 \times 10^{17}$ cm$^{-3}$ and a thickness of 0.5 micrometers. A p-type contact layer 48 was formed on a top surface of the p-type cladding layer 47, wherein the p-type contact layer 48 comprises an Mg-doped p-type GaN layer having a magnesium impurity concentration of $2 \times 10^{17}$ cm$^{-3}$ and a thickness of 0.1 micrometer.

Those layers 42, 43, 44, 45, 46, 47, and 48 were formed by a low pressure metal organic vapor phase epitaxy method under a pressure of 200 hPa. A partial pressure of the ammonium gas for nitrogen source was maintained at 53 hPa. TMG was used for the Ga source material. TMA was used for the Al source material. TMI was used for the In source material. The growth temperature was maintained at 1050° C. except when the InGaN single quantum well active layer 44 and the undoped optical confinement layer 46 were grown. In the growth of the InGaN singlw quantum well active layer 44, the growth temperature was maintained at 780° C. In the growth of the undoped optical confinement layer 46, the growth temperature was maintained at 1150° C.

After the formed structure was subjected to a heat treatment at 900° C. for 1 hour, a dry etching process was then carried out to selectively etch the p-type cladding layer 47 and the p-type contact layer 48 thereby forming a mesa structure 49. A silicon dioxide film 50 was formed on the mesa structure 49 and the upper surfaces of the p-type contact layer 48. The silicon dioxide film 50 was selectively removed from the top surface of the mesa structure 49 by use of an exposure technique, whereby the top surface of the p-type contact layer 48 was shown and a ridged structure was formed.

An n-type electrode 51 was formed on a bottom surface of the substrate 41, wherein the n-type electrode 51 comprises laminations of a titanium layer and an aluminum layer. A p-type electrode 52 was formed on a top surface of the p-type contact layer 48, wherein the p-type electrode 52 comprises laminations of a nickel layer and a gold layer. The above structure was then cleaved to form first and second facets which defines a cavity length of 300 micrometers. Only the second facet was then coated with a highly reflective coat of a reflectance factor of 95%, wherein the highly reflective coat comprises laminations of titanium dioxide film and silicon dioxide film. The first facet was uncoated.

For the method of forming the above laser device, the following three points are important. First, the multi-layered structure was grown under the condition of the low partial pressure of ammonium. Second, a heat treatment was then carried out at about 900° C. for one hour after the multi-layered structure had been grown. Third, the GaN optical confinement layer 46 was undoped and its growth temperature was high, for example, 1150° C.

The first important point is to reduce both the "microscopic fluctuation" and the "macroscopic fluctuation" in the composition of the quantum well in the active layer. The present inventors discovered that after the quantum well having the small "microscopic fluctuation" and the small "macroscopic fluctuation" has been grown, then the high temperature heat treatment is carried out thereby to cause that only the "microscopic fluctuation" becomes large whilst the "macroscopic fluctuation" remains small. The present inventors also discovered that an optical absorption into the GaN optical confinement layer is the main cause for the internal loss.

In order to reduce the optical absorption into the GaN optical confinement layer, it is effective to improve the crystal quality. To improve the crystal quality, it is effective to increase the growth temperature of the GaN optical confinement layer. In addition, in order to reduce the optical absorption through the impurity level, Mg is not doped into the GaN optical confinement layer.

It was confirmed that the semiconductor laser device exhibits the following characteristics. The usage of the semiconductor laser device is the high output laser diode. The number of the quantum well is 1. The cavity length was 500 micrometers. The threshold mode gain for the single quantum well is 29 cm$^{-1}$. The first mirror reflectance of the first facet uncoated, from which the light is emitted, is 19%. The second mirror reflectance of the second facet with HR-coat opposite to the first facet is also 95%. The mirror loss is 17 cm$^{-1}$. The internal loss is 12 cm$^{-1}$. The slope efficiency is 1.7 (W/A). The standard deviation of the microscopic fluctuation of the indium composition is 0.0083. The standard deviation of the microscopic fluctuation of the band gap energy is 5 meV. The differential gain "dg/dN" is $2.2 \times 10^{-20}$ m². The threshold current density is 0.8 (kA/cm²). The photo-luminescence peak wavelength distribution is within 17 meV The threshold current is sufficiently low.

Although the invention has been described above in connection with several preferred embodiments therefor, it will be appreciated that those embodiments have been provided solely for illustrating the invention, and not in a limiting sense. Numerous modifications and substitutions of equivalent materials and techniques will be readily apparent to those skilled in the art after reading the present application, and all such modifications and substitutions are expressly understood to fall within the true scope and spirit of the appended claims.

What is claimed is:

1. A semiconductor device having a semiconductor multi-layer structure which includes at least an active layer having at least a quantum well, and said active layer further including at least a luminescent layer of $In_xAl_yGa_{1-x-y}N$ ($0<x<1$, $0 \leq y \leq 0.2$),
   wherein a threshold mode gain of each of said at least quantum well is not more than 12 cm⁻¹, and
   wherein a differential gain "dg/dn" of said at least active layer satisfies $0.5 \times 10^{-20}(m^2) \leq dg/dn \leq 0.7 \times 10^{-20}(m^2)$.

2. The semiconductor device as claimed in claim 1, wherein a standard deviation of a microscopic fluctuation in a band gap energy of said at least luminescent layer is in the range of 75 meV to 200 meV.

3. The semiconductor device as claimed in claim 1, wherein said semiconductor device has an internal loss "$\alpha_i$" (cm⁻¹) which satisfies $\alpha_i \leq 12 \times n - \alpha_m$ (cm⁻¹), where "$\alpha_m$" is a mirror loss, and "n" is a number of said at least quantum well.

4. The semiconductor device as claimed in claim 1, wherein said semiconductor device has a slope efficiency "S" (W/A) which satisfies:

$$S \geq 3 \times \{\alpha_m/(12 \times n)\} \times [\{(1-R_1)\sqrt{(R_2)}\}/\{(1-\sqrt{(R_1R_2)}) \times (\sqrt{(R_1)}+\sqrt{(R_2)})\}],$$

where "$R_1$" is a first reflectance of a first cavity facet, from which a light is emitted, "$R_2$" is a second reflectance of a second cavity facet opposite to said first cavity facet, "$\alpha_m$" is a mirror loss, and "n" is a number of said at least quantum well.

5. The semiconductor device as claimed in claim 4, wherein said semiconductor device has a cavity length "L" of not less than 200 micrometers, and each of said first and second reflectances "$R_1$" and "$R_2$" is not less than 80% and less than 100%, and said slope efficiency "S" satisfies $S \geq 1.4/n$ (W/A).

6. The semiconductor device as claimed in claim 1, wherein said semiconductor device has a photo-luminescence peak wavelength distribution of not more than 40 meV.

7. The semiconductor device as claimed in claim 1, wherein said semiconductor multi-layer structure comprises a gallium-nitride-based multi-layer structure.

8. The semiconductor device as claimed in claim 7, wherein said gallium-nitride-based multi-layer structure extends over a gallium-nitride-based substrate.

9. The semiconductor device as claimed in claim 7, wherein said gallium-nitride-based multi-layer structure extends over a sapphire substrate.

10. The semiconductor device as claimed in claim 7, wherein said gallium-nitride-based multi-layer structure extends over a substrate having a surface dislocation density of less than $1 \times 10^8$/cm².

* * * * *